United States Patent
Lee et al.

(10) Patent No.: US 11,773,478 B2
(45) Date of Patent: Oct. 3, 2023

(54) MASK, METHOD OF PROVIDING MASK, AND METHOD OF PROVIDING DISPLAY PANEL USING THE SAME

(71) Applicant: Samsung Display Co., Ltd., Yongin-si (KR)

(72) Inventors: Duckjung Lee, Hwaseong-si (KR); Ji-Hee Son, Hwaseong-si (KR); Sungsoon Im, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/307,386

(22) Filed: May 4, 2021

(65) Prior Publication Data

US 2022/0049343 A1 Feb. 17, 2022

(30) Foreign Application Priority Data

Aug. 14, 2020 (KR) .................. 10-2020-0102505

(51) Int. Cl.
*C23C 14/04* (2006.01)
*H10K 71/00* (2023.01)
*H10K 71/16* (2023.01)

(52) U.S. Cl.
CPC ........... *C23C 14/042* (2013.01); *H10K 71/00* (2023.02); *H10K 71/166* (2023.02)

(58) Field of Classification Search
CPC .................. C23C 14/042; H01L 51/0011
See application file for complete search history.

(56) References Cited

U.S. PATENT DOCUMENTS

| 9,530,988 B2 | 12/2016 | Lee et al. |
| 9,842,781 B2 | 12/2017 | Lee et al. |
| 2002/0145714 A1* | 10/2002 | Hirayanagi ............ G03B 27/42 355/75 |

(Continued)

FOREIGN PATENT DOCUMENTS

| JP | 2004183044 A | 7/2004 |
| JP | 2015-014024 A | 1/2015 |

(Continued)

OTHER PUBLICATIONS

English translation JP 6163376, Mizumura(水村), Jul. 2017 (Year: 2017).*

(Continued)

*Primary Examiner* — Keath T Chen
(74) *Attorney, Agent, or Firm* — CANTOR COLBURN LLP

(57) ABSTRACT

A deposition mask includes a mask film including a polymer, a plurality of first deposition openings defined in the mask film, and a conductive layer which is on the mask film and receives a power. The conductive layer includes a first conductive pattern and a second conductive pattern spaced apart from each other along the mask film and electrically disconnected from each other. The conductive layer receives the power at the first conductive pattern and the second conductive pattern, and receipt of the power at the first conductive pattern and the second conductive pattern provides an electrostatic chuck function of the deposition mask.

19 Claims, 23 Drawing Sheets

(56) References Cited

U.S. PATENT DOCUMENTS

| | | | |
|---|---|---|---|
| 2004/0142108 A1 | 7/2004 | Atobe et al. | |
| 2014/0357003 A1* | 12/2014 | Yu | H01L 51/0011 438/34 |
| 2018/0340252 A1 | 11/2018 | Vazan et al. | |
| 2019/0211437 A1 | 7/2019 | Obata et al. | |
| 2021/0217997 A1 | 7/2021 | Kwag et al. | |
| 2022/0010421 A1 | 1/2022 | Moon et al. | |

FOREIGN PATENT DOCUMENTS

| | | | | |
|---|---|---|---|---|
| JP | 6142388 B2 | 6/2017 | | |
| JP | 6163376 | * | 7/2017 | C23C 14/04 |
| JP | 6168944 B2 | 7/2017 | | |
| KR | 1020040042160 A | 5/2004 | | |
| KR | 1020160070250 A | 6/2016 | | |
| KR | 1020160116156 A | 10/2016 | | |
| KR | 1020210091382 A | 7/2021 | | |
| KR | 1020220006152 A | 1/2022 | | |

OTHER PUBLICATIONS

European Search Report for European Patent Application No. 21191128.4 dated Jan. 14, 2022.

* cited by examiner

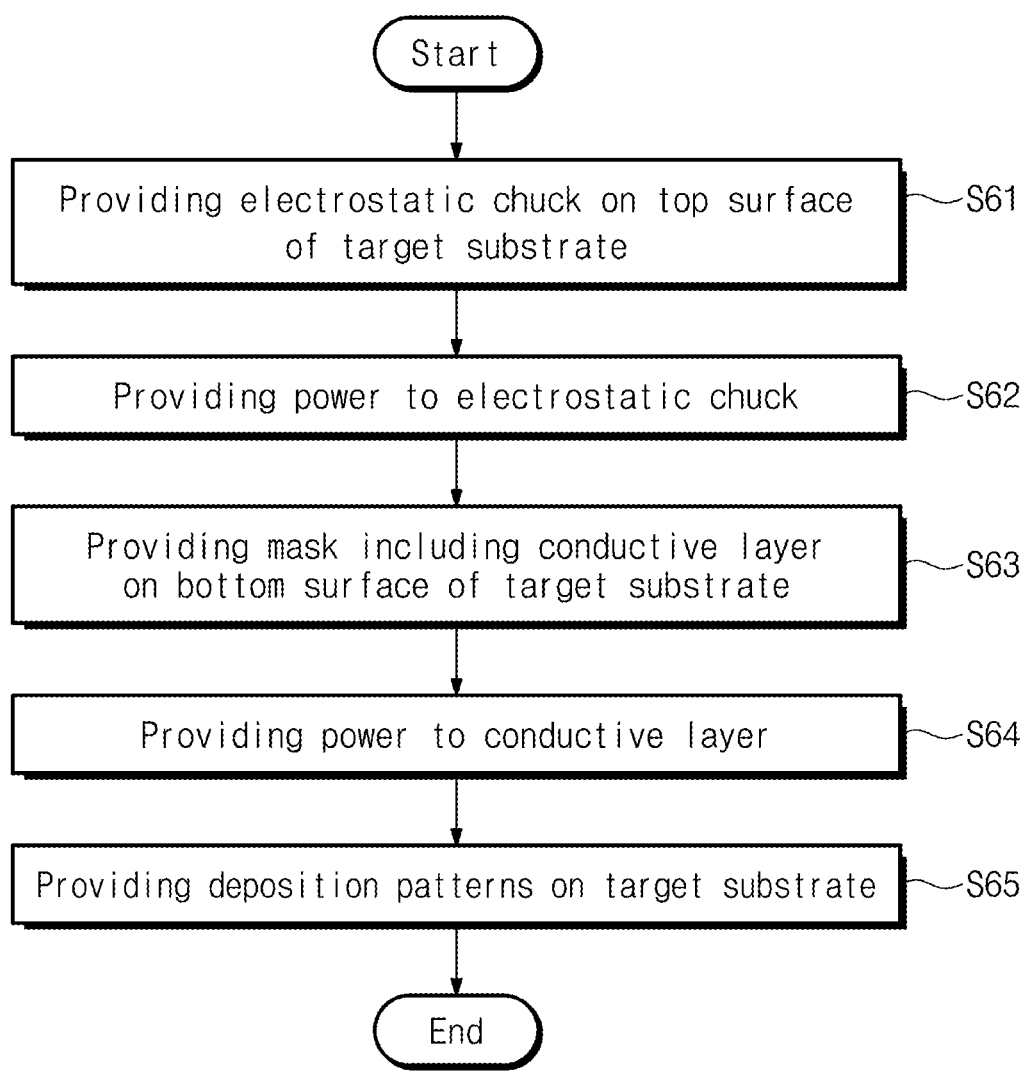

FIG. 11A
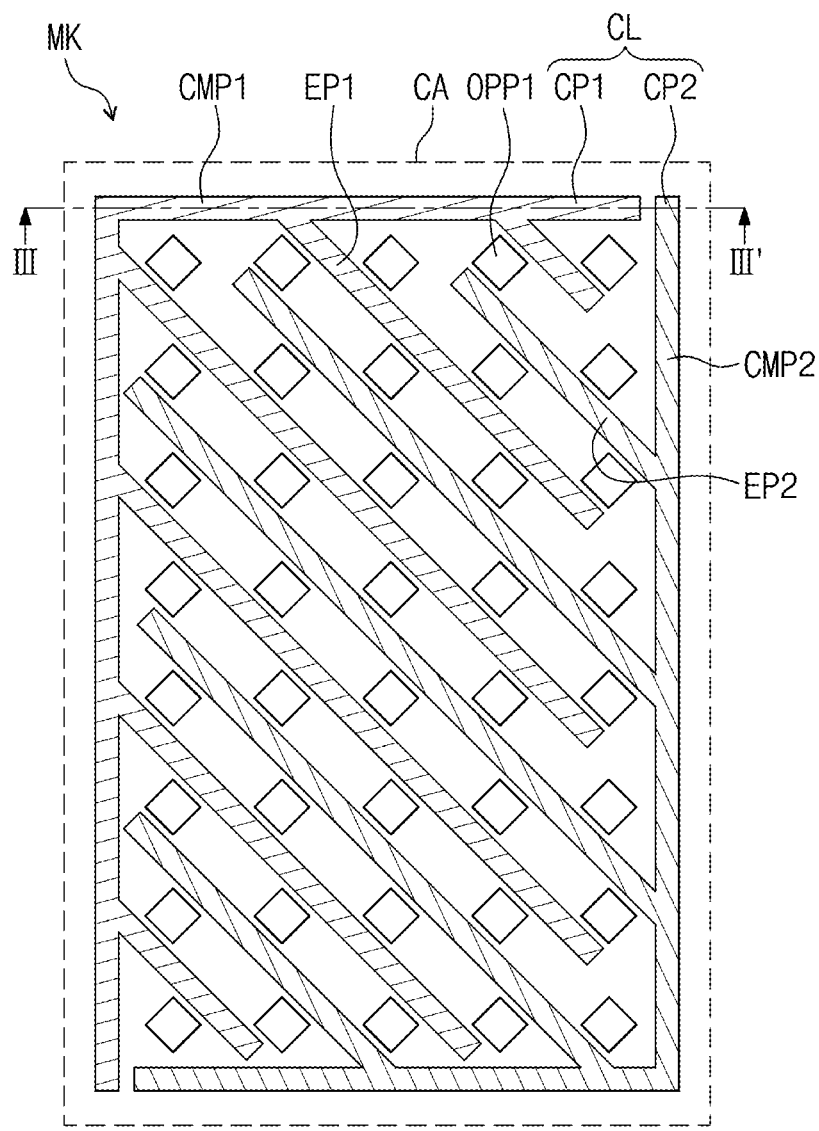

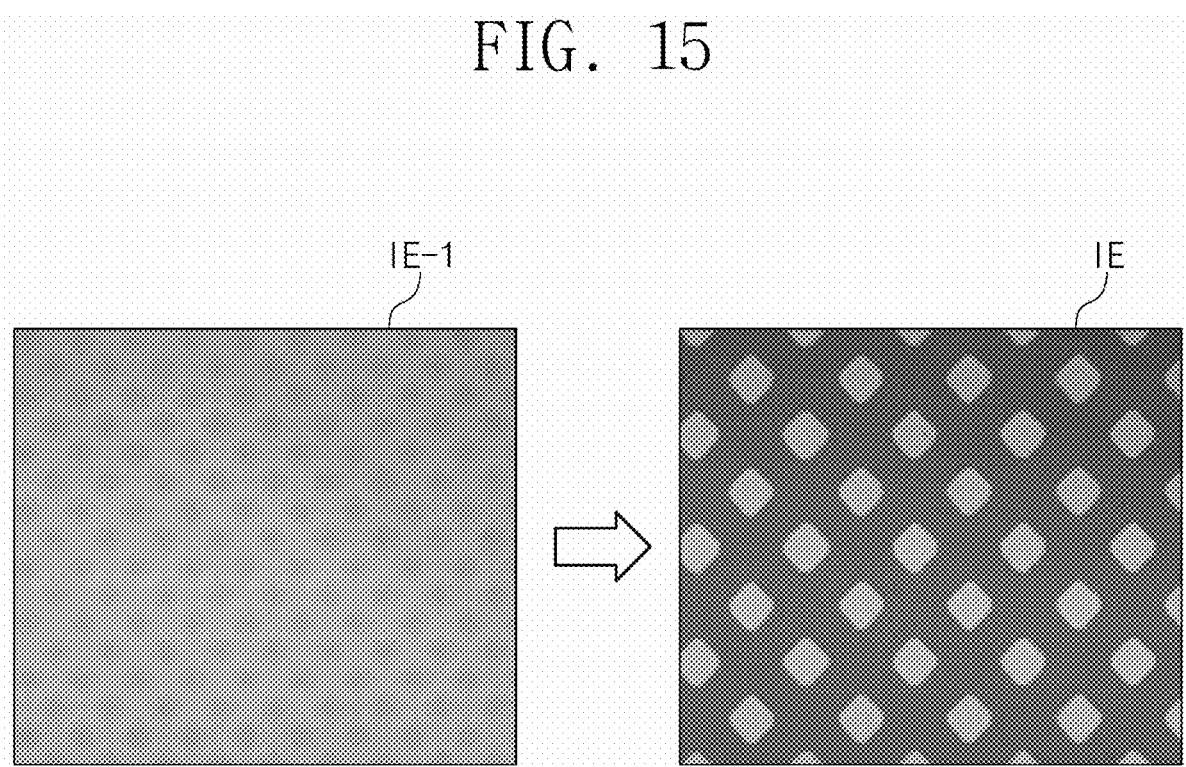

MASK, METHOD OF PROVIDING MASK, AND METHOD OF PROVIDING DISPLAY PANEL USING THE SAME

This application claims priority to Korean Patent Application No. 10-2020-0102505, filed on Aug. 14, 2020, and all the benefits accruing therefrom under 35 U.S.C. § 119, the entire contents of which are hereby incorporated by reference.

BACKGROUND

(1) Field

The disclosure relates to a mask, a method of providing a mask, and a method of providing a display panel, and in particular, to a method of providing or manufacturing a mask with improved process yield and reliability, a mask provided thereby, and a method of providing a display panel using the mask.

(2) Description of the Related Art

A display panel includes a plurality of pixels. Each of the pixels includes a driving device (e.g., a transistor) and a display device (e.g., an organic light-emitting diode). The display device is provided or formed by stacking an electrode and a light-emitting pattern on a substrate.

A mask with a penetration region is provided or formed to define a deposition region with which the light-emitting pattern will be provided or formed. The light-emitting pattern is provided or formed corresponding to the region of the substrate which is exposed to outside the mask by the penetration region. The shape of the light-emitting pattern is controlled by the shape of the penetration region of the mask.

SUMMARY

An embodiment provides a mask having improved reliability relative to a deposition process, a method of providing the mask, and a method of providing a display panel using the mask.

An embodiment provides a mask which reduces or effectively prevents failures (e.g., a shadow problem) from occurring in a deposition process performed using the same, a method of providing the mask with reduced process time and cost, and a method of providing a display panel using the mask.

An embodiment provides a mask which has an improved holding strength relative to a target substrate with a circuit device layer and reduces or effectively prevents failures (e.g., a shadow problem) in a deposition process on the target substrate, a method of providing the mask, and a method of providing a display panel using the mask.

According to an embodiment, a deposition mask includes a mask film including a polymer, a plurality of first deposition openings (e.g., penetration regions) defined in the mask film, and a conductive layer which is on the mask film and receives a power. The conductive layer includes a first conductive pattern and a second conductive pattern spaced apart from each other along the mask film and electrically disconnected from each other. The conductive layer receives the power at the first conductive pattern and the second conductive pattern, and receipt of the power at the first conductive pattern and the second conductive pattern provides an electrostatic chuck function of the deposition mask.

In an embodiment, the mask film may include polyimide ("PI").

In an embodiment, the conductive layer may include a conductive metal or a conductive metal oxide, the conductive metal may include at least one of nickel (Ni), gold (Au), titanium (Ti) and molybdenum (Mo), and the conductive metal oxide may include at least one of indium tin oxide ("ITO") and indium zinc oxide ("IZO").

In an embodiment, the first conductive pattern may include a first common portion which is extended along a first direction, and a plurality of first electrode portions each of which is extended from the first common portion along a second direction crossing the first direction, and the second conductive pattern may include a second common portion which is extended along the first direction, and a plurality of second electrode portions each of which is extended from the second common portion along the second direction.

In an embodiment, the first electrode portions and the second electrode portions may be alternately arranged along the first direction.

In an embodiment, the conductive layer may not overlap with the plurality of penetration regions.

In an embodiment, the mask may further include an additional mask film which is on the mask film and includes the polymer. The conductive layer may be between the mask film and the additional mask film.

In an embodiment, the first conductive pattern may include a first pad portion which is not covered by the additional mask film and is exposed to outside thereof, and the second conductive pattern may include a second pad portion which is not covered by the additional mask film and is exposed to outside thereof.

In an embodiment, the deposition mask having the electrostatic chuck function may be removably attached to a target substrate in a deposition process, and the deposition mask which is removably attached to the target substrate may dispose the mask film between the conductive layer and the target substrate.

In an embodiment, the conductive layer may include a plurality of second deposition openings (e.g., a plurality of openings) which are respectively overlapped with the plurality of penetration regions.

In an embodiment, the plurality of first electrode portions and the plurality of second electrode portions may include the plurality of openings which are respectively overlapped with the plurality of penetration regions.

According to an embodiment, a method of providing a mask includes providing a preliminary mask film including a polymer resin, providing a plurality of first deposition openings extended through the preliminary mask film to define a mask film of the deposition mask, and providing a conductive layer which is on the mask film and receives a power. The conductive layer includes a first conductive pattern and a second conductive pattern spaced apart from each other along the mask film and electrically disconnected from each other, the conductive layer receives the power at the first conductive pattern and the second conductive pattern, and receipt of the power at the first conductive pattern and the second conductive pattern provides an electrostatic chuck function of the deposition mask.

In an embodiment, the polymer resin may include polyimide ("PI").

In an embodiment, the conductive layer may include a conductive metal or a conductive metal oxide, the conductive metal may include at least one of nickel (Ni), gold (Au), titanium (Ti) and molybdenum (Mo), and the conductive metal oxide may include at least one of indium tin oxide ("ITO") and indium zinc oxide ("IZO").

In an embodiment, the providing the plurality of first deposition openings in the preliminary mask film may include providing a plurality of second deposition openings which are in the first conductive pattern and the second conductive pattern of the conductive layer and respectively aligned with the plurality of first deposition openings.

In an embodiment, the providing the plurality of first deposition openings in the preliminary mask film may include irradiating a laser through the preliminary mask film and the conductive layer to respectively define the plurality of first deposition openings and the plurality of second deposition openings.

In an embodiment, the method may further include providing an additional mask film facing the mask film to cover the conductive layer.

According to an embodiment, a method of providing a display panel includes providing a target substrate, providing an electrostatic chuck facing the target substrate, providing a deposition mask including a mask film including a polymer and in which a plurality of first deposition openings of the deposition mask are defined, and a conductive layer which is on the mask film and receives a power, providing the deposition mask facing the electrostatic chuck with the target substrate therebetween to dispose the target substrate, the mask film and the conductive layer in order from the electrostatic chuck, and providing a plurality of deposition patterns of the display panel which are on the target substrate and correspond to the plurality of first deposition openings of the deposition mask.

In an embodiment, the providing of the deposition mask facing the electrostatic chuck may include providing a power of first power source to the electrostatic chuck to provide a first electrostatic force thereof, and providing the power of a second power source to the conductive layer to provide a second electrostatic force of the deposition mask.

In an embodiment, the conductive layer may include a first conductive pattern and a second conductive pattern which are spaced apart from each other. The providing of the power of the second power source to the conductive layer may include providing a connection of one among the first conductive pattern and the second conductive pattern to a positive terminal of the second power source, and providing connection of the other one among the first conductive pattern and the second conductive pattern to a negative terminal of the second power source.

In an embodiment, the mask film may include polyimide ("PI"), the conductive layer may include a conductive metal or a conductive metal oxide, the conductive metal may include at least one of nickel (Ni), gold (Au), titanium (Ti) and molybdenum (Mo), and the conductive metal oxide may include at least one of indium tin oxide ("ITO") and indium zinc oxide ("IZO").

In an embodiment, the providing of the deposition mask facing the electrostatic chuck may include the electrostatic chuck provides a first electrostatic force thereof, the conductive layer of the deposition mask which receives the power provides a second electrostatic force of the deposition mask, and the first electrostatic force together with the second electrostatic force provides the mask film of the deposition mask in direct contact with the target substrate.

In an embodiment, the providing of the deposition mask may include providing a preliminary conductive layer on the mask film, providing a first conductive pattern and a second conductive pattern of the conductive layer which are spaced apart from each other along the mask film and electrically disconnected from each other, and providing the first deposition openings in the mask film.

In an embodiment, the providing of the deposition mask may further include providing a plurality of second deposition openings which are in the first conductive pattern and the second conductive pattern and aligned with the first deposition openings in the mask film.

BRIEF DESCRIPTION OF THE DRAWINGS

Embodiments will be more clearly understood from the following brief description taken in conjunction with the accompanying drawings. The accompanying drawings represent non-limiting embodiments as described herein.

FIG. 6 is a flow chart illustrating an embodiment of a method of fabricating a display panel using a mask.

FIGS. 11A and 11B are plan views illustrating embodiments of a mask.

FIG. 15 is an image showing a comparative deposition pattern and an embodiment of a deposition pattern.

Figure 1:
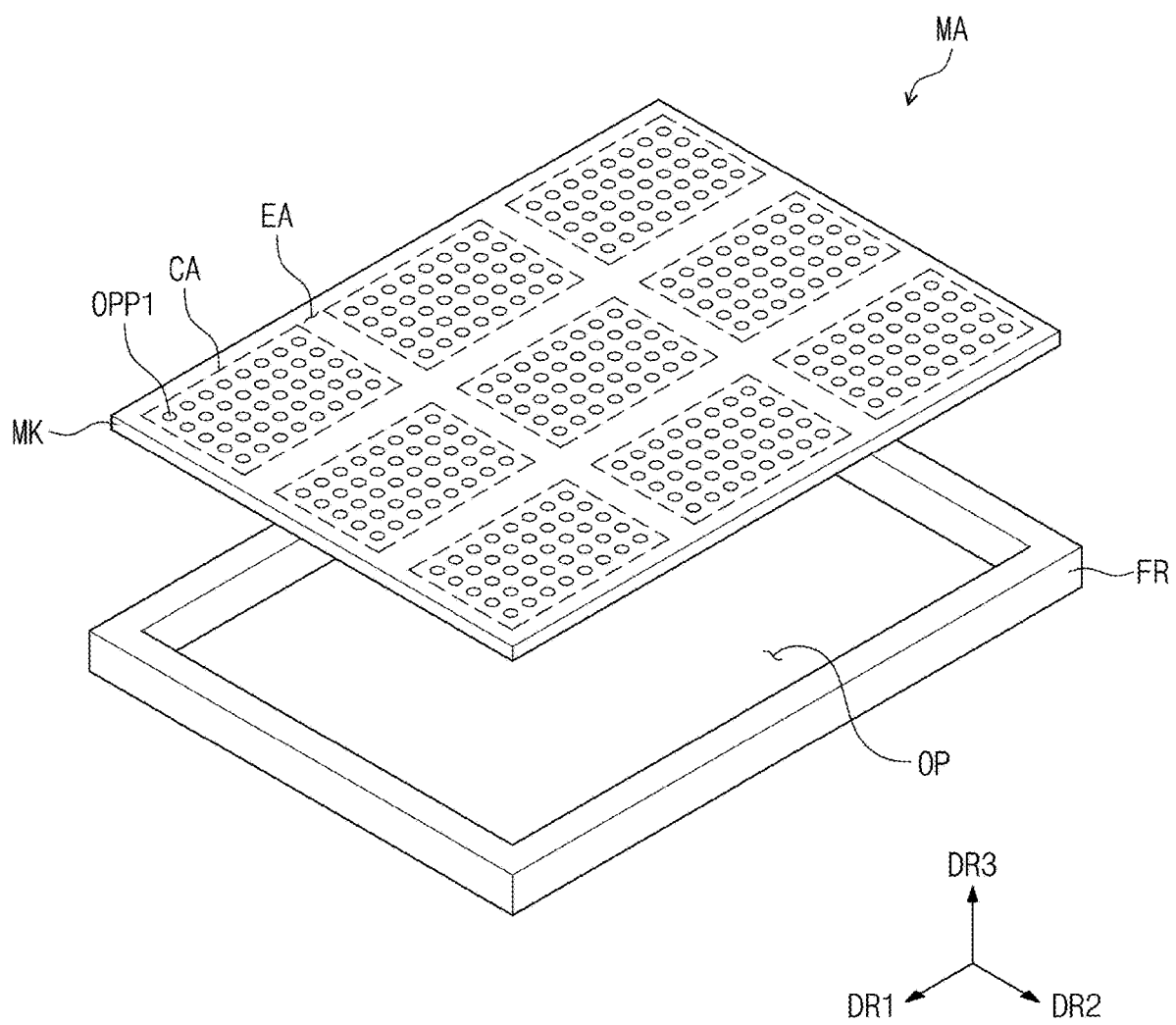
FIG. 1 is an exploded perspective view illustrating an embodiment of a mask assembly.

It should be noted that these figures are intended to illustrate the general characteristics of methods, structure and/or materials utilized in embodiments and to supplement the written description provided below. These drawings are not, however, to scale and may not precisely reflect the precise structural or performance characteristics of any given embodiment, and should not be interpreted as defining or limiting the range of values or properties encompassed by the embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments will now be described more fully with reference to the accompanying drawings, in which embodiments are shown. Embodiments may, however, be embodied in many different forms and should not be construed as being limited to the embodiments set forth herein, rather, these embodiments are provided so that this disclosure will be thorough and complete, and will fully convey the concept of the embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present.

It will be understood that, although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of embodiments. As used herein, the singular forms "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein the term "and/or" includes any and all combinations of one or more of the associated listed items. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Embodiments are described herein with reference to cross-sectional illustrations that are schematic illustrations of idealized embodiments (and intermediate structures) of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is an exploded perspective view illustrating an embodiment of a mask assembly MA.

Referring to FIG. 1, a mask assembly MA may be used for a process of providing deposition material DM (for example, see FIG. 10A) onto a target. In an embodiment, the mask assembly MA may include a frame FR and a mask MK.

A front surface of each element may be parallel to a plane defined by a first direction DR1 and a second direction DR2 crossing each other. A thickness direction of each element may be referred to along a third direction DR3 which crosses each of the first direction DR1 and the second direction DR2. An upper or top portion and a lower or bottom portion of each member may be distinguished, based on the third direction DR3. However, directions indicated by the first to third directions DR1, DR2 and DR3 may be relative concepts, and may be variously changed to indicate other directions.

The frame FR may have a closed shape such as a ring shape, in a plan view (e.g., along the third direction DR3). In other words, an open region OP may be provided at an inner region of the frame FR. A center of the frame FR is located in the inner region. The open region OP may be a hole that penetrates through a thickness of the frame FR, such as from the front surface of the frame FR to the rear surface of the frame FR. The open region OP may be open to outside the frame FR along both the third direction DR3 and a direction opposite thereto.

FIG. 1 illustrates the frame FR which is provided to have a rectangular ring shape, but the shape of the frame FR is not limited to this example. In an embodiment, for example, the frame FR may have various closed shapes (e.g., circular or polygonal rings). FIG. 1 illustrates an example in which the frame FR is disposed below the mask MK and is used to support the mask MK, but is not limited to this example. In an embodiment, for example, the frame FR may be disposed on or below an edge region of the mask MK to support the mask MK and may fix positions of the mask MK along the first and second directions DR1 and DR2.

In an embodiment, the mask MK may include a cell region CA provided in plural including a plurality of cell regions CA that are arranged along the first and second directions DR1 and DR2. In the embodiment, three cell regions are illustrated to be spaced apart from each other along each of the first and second directions DR1 and DR2, but the mask MK may further include additional cell regions. In an embodiment, the cell regions CA may be arranged along only one of the first and second directions DR1 and DR2, without being limited thereto.

In an embodiment, the mask MK may have a plate shape that is extended along the first and second directions DR1 and DR2. The mask MK may include the cell regions CA which are arranged along the first and second directions DR1 and DR2, and may have a plate shape in which all of the cell regions CA are provided. The mask MK may include the cell regions CA and an extension region EA which is adjacent to the cell regions CA such as surrounding the cell regions CA. The cell regions CA may be connected to each other by the extension region EA. The mask MK may be a single, unitary object provided in the form of a plate. In an embodiment, since a mask film MF (e.g., see FIG. 3A) used as a main body of the mask MK includes or is formed of a polymer material (e.g., polyimide ("PI")), the mask MK may be provided or formed to have a plate shape which is extended along both of the first and second directions DR1 and DR2, different from a stick shape extended in only of the first or second directions DR1 or DR2. However, the invention is not limited to this example, and in embodiments, the mask MK may include stick-shaped patterns which are extended along one among the first and second directions DR1 and DR2 and are spaced apart from each other along the other among the first and second directions DR1 and DR2.

A penetration region OPP1 may includes a plurality of penetration regions OPP1 (e.g., first openings or first deposition openings) defined in each of the cell regions CA. Within a cell region CA, the penetration regions OPP1 may be arranged spaced apart from each other along both the first and second directions DR1 and DR2. Each of the penetration regions OPP1 may be defined to penetrate the mask MK along the third direction DR3 of the mask MK (hereinafter, a third direction DR3). Within a cell region CA, the penetration regions OPP1 may be defined in a matrix shape to form a plurality of columns each extending along the first direction DR1 and a plurality of rows each extending along the second direction DR2.

Figure 2A:
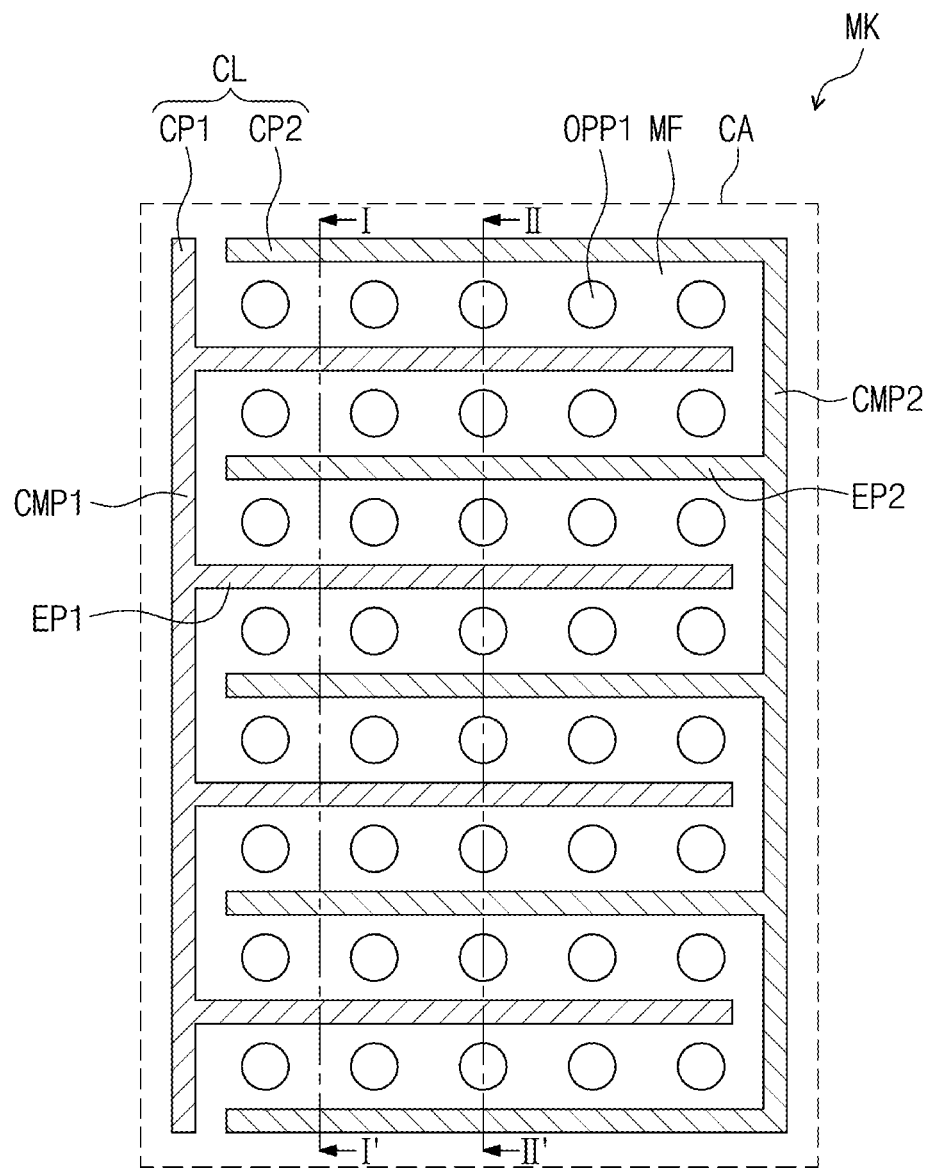
FIGS. 2A and 2B are plan views illustrating an embodiment of a mask.
Figure 2B:
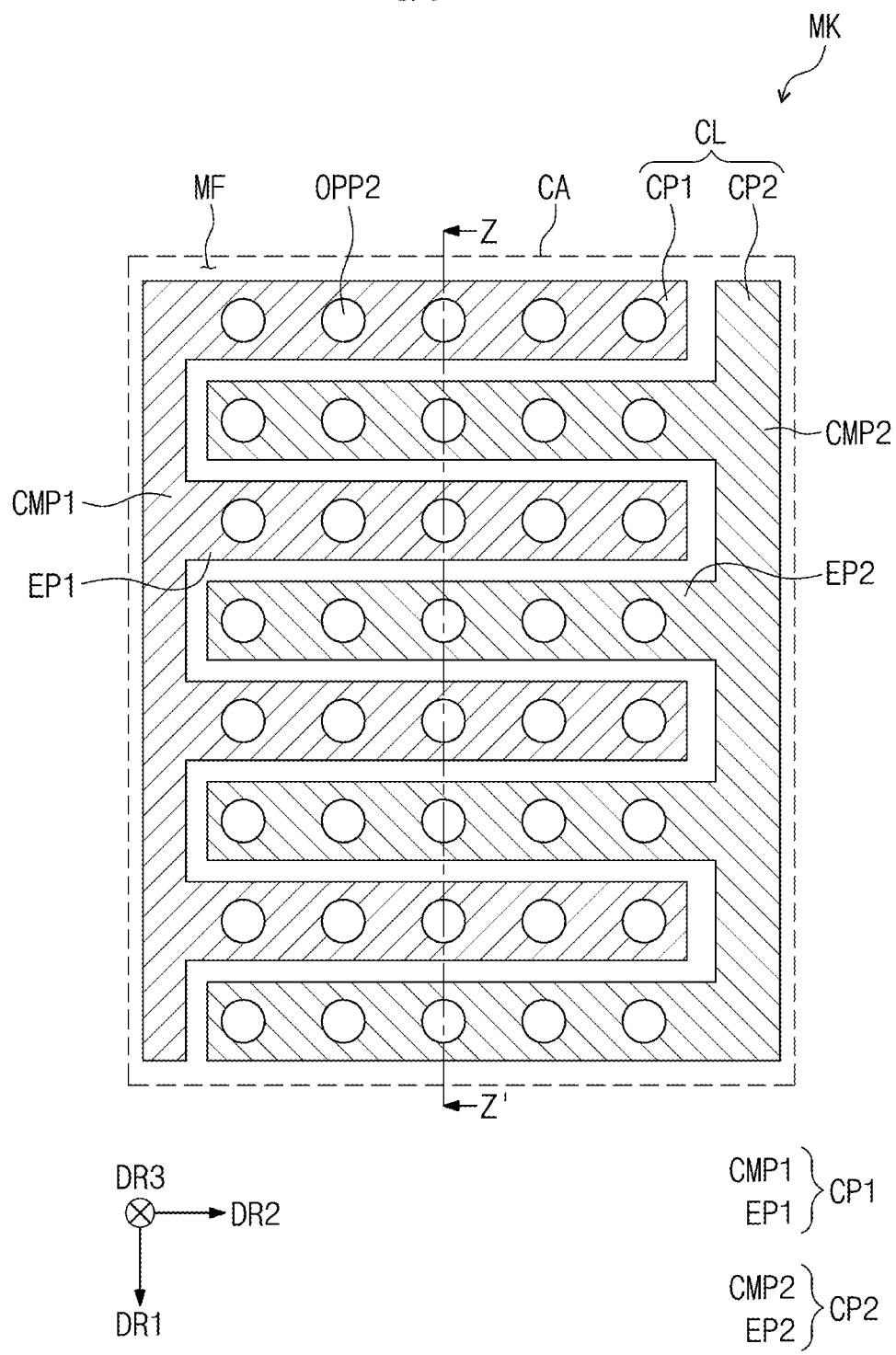
Figure 3A:
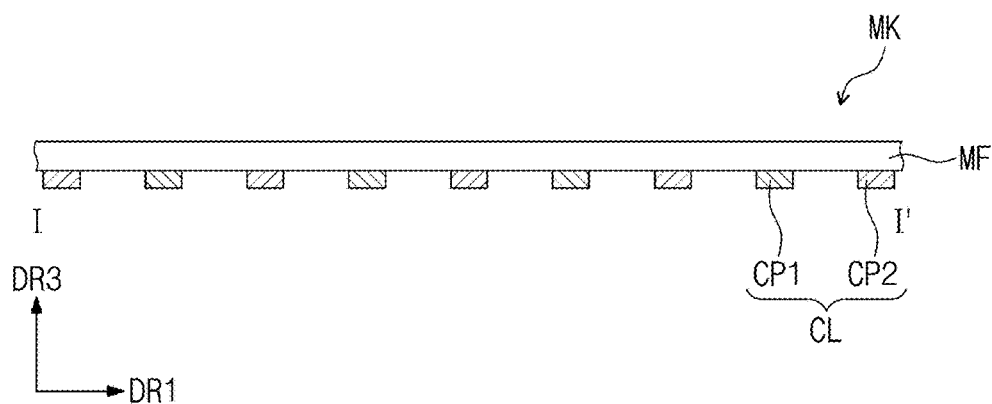
FIGS. 3A to 3C are cross-sectional views illustrating an embodiment of a mask.
Figure 3B:
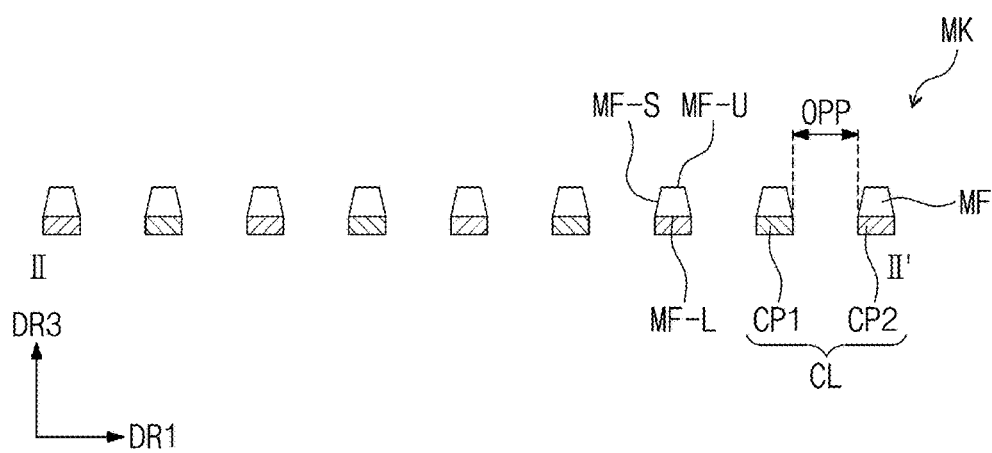
Figure 3C:
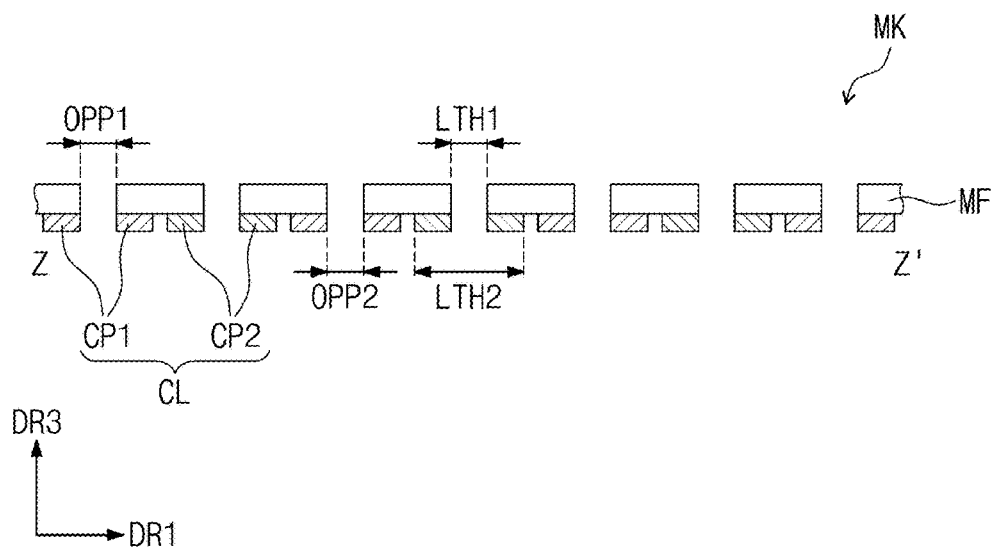

FIGS. 2A and 2B are plan views illustrating an embodiment of a mask MK. FIGS. 3A to 3C are cross-sectional views illustrating an embodiment of a mask MK.

FIGS. 2A and 2B are plan views illustrating a view of the rear surface of the mask MK. In an embodiment, a target substrate SUB (for example, see FIG. 7A) may be disposed on the front surface of the mask MK. FIG. 3A is a cross-sectional view taken along line I-I' of FIG. 2A, and FIG. 3B is a cross-sectional view taken along line II-IP of FIG. 2A. FIG. 3C is a cross-sectional view taken along line Z-Z' of FIG. 2B. Here, the rear surface is a surface of the mask MK which faces the frame FR (e.g., see FIG. 1), and the front surface is a surface of the mask MK that is opposite to the rear surface thereof.

Referring to FIGS. 2A to 3C, the mask MK may include the mask film MF and a conductive layer CL. In the embodiment shown in FIGS. 2A and 2B, the conductive layer CL may be disposed on a surface of the mask film MF. A penetration region OPP1 may be defined in the mask MK. The penetration regions OPP1 may be defined in the mask MK. The penetration regions OPP1 may be spaced apart from each other by a distance along the first and/or second directions DR1 and/or DR2, thereby providing or forming a pattern of the penetration region OPP1. Each of the penetration regions OPP1 may be defined to penetrate the mask MK along the third direction DR3.

The mask film MF may be formed of or include a polymer resin. In an embodiment, the mask film MF may include polyimide ("PI"). The mask film MF may include or be formed of polyimide (PD). The mask film MF may be a plate-shaped structure extending along the first and second directions DR1 and DR2.

In an embodiment, a thickness of the mask film MF may range from about 3 micrometers (µm) to about 50 µm. The thickness of the mask film MF which is smaller than about 3 µm may provide low durability of the mask MK such that performing a deposition process with the mask MK is difficult. The thickness of the mask film MF which is larger than about 50 µm may provide low deposition precision in a deposition process.

The mask MK may include the conductive layer CL disposed on the mask film MF. The conductive layer CL may be formed of or include at least one of conductive metals and conductive metal oxides. In an embodiment, the conductive layer CL may include at least one of conductive metals (e.g., nickel (Ni), gold (Au), titanium (Ti) and molybdenum (Mo)), and conductive metal oxides (e.g., indium tin oxide ("ITO") and indium zinc oxide ("IZO")). The conductive layer CL may be disposed on a bottom surface MF-L of the mask film MF.

An inner surface MF-S (e.g., sidewall) of the mask film MF may define the penetration regions OPP1 in the mask MK, and the inner surface MF-S may not be covered with the conductive layer CL and may be exposed to outside the conductive layer CL. A minimum dimension OPP of the penetration regions OPP1 may be defined at an interface between the mask film MF and the conductive layer CL. The conductive layer CL may be provided or formed on the bottom surface MF-L of the mask film MF. Since a plurality of penetration regions OPP1 are provided or formed after the formation of the conductive layer CL, the conductive layer CL may not cover or extend along the inner surface MF-S of the mask film MF. A target substrate SUB may be placed on a top surface MF-U of the mask film MF.

A thickness of the conductive layer CL may range from about 3 nanometers (nm) to about 5 µm. The thickness of the conductive layer CL which is smaller than about 3 nm may provide difficulty in inducing a sufficiently strong electrostatic force in a static electricity inducing element (e.g., an electrostatic chuck) during the deposition process, such that the mask MK and the target substrate SUB may not be strongly held to each other. The thickness of the conductive layer CL which is larger than about 5 µm may deteriorate deposition precision in the deposition process using the mask MK.

In an embodiment, the conductive layer CL may include a first conductive pattern CP1 and a second conductive pattern CP2 which are spaced apart from each other in a direction along the mask film MF. In other words, the first and second conductive patterns CP1 and CP2 may not be electrically connected to each other (e.g., electrically disconnected from each other). The first and second conductive patterns CP1 and CP2 are in a same layer as each other.

The first conductive pattern CP1 may include a first common portion CMP1 which is extended along the first direction DR1, and a first electrode portion EP1 provided in plural including a plurality of first electrode portions EP1 each of which is extended from the first common portion CMP1 in the second direction DR2. In an embodiment, the first common portion CMP1 extends to define each of the first electrode portions EP1. The second conductive pattern CP2 may include a second common portion CMP2 which is extended along the first direction DR1, and a second electrode portion EP2 provided in plural including a plurality of second electrode portions EP2 each of which is extended from the second common portion CMP2 in the second direction DR2. In an embodiment, the second common portion CMP2 extends to define each of the second electrode portions EP2. The first electrode portions EP1 may be electrically connected to the first common portion CMP1, and the second electrode portions EP2 may be electrically connected to the second common portion CMP2. The shapes and arrangements of the first and second conductive patterns CP1 and CP2 are not limited to the example of FIGS. 2A and 2B, and may be variously changed as long as they are not overlapped with the penetration regions OPP1 and are spaced apart from each other.

In the embodiment shown in FIGS. 2A and 3B, the first and second conductive patterns CP1 and CP2 may be disposed such that they are not overlapped with the penetration regions OPP1, in a plan view. As being not overlapped with the penetration regions OPP1, edges of the first and second conductive patterns CP1 and CP2 may be aligned with edges of the mask film MF at the penetration regions OPP1 (FIG. 3B). As being not overlapped with the penetration regions OPP1, the first and second conductive patterns CP1 and CP2 may be spaced apart from the penetration regions OPP1 along the first direction DR1 and/or the second direction DR2, such as by portions of the mask film MF (along line II-IF of FIG. 2A). In an embodiment, the first conductive pattern CP1 and the second conductive pattern CP2 of the conductive layer CL are spaced apart from each other along the mask film MF by a gap, and the gap is aligned with the plurality of first deposition openings (e.g., the penetration regions OPP1).

The first electrode portions EP1 and the second electrode portions EP2 may alternate with each other along the first direction DR1. The penetration regions OPP1 may be disposed between the first electrode portions EP1 and the second electrode portions EP2, respectively. In an embodiment, a first electrode portion EP1 and a second electrode portion EP2 may be adjacent to each other along the first direction DR1, and penetration regions OPP1 may be disposed between the adjacent electrode portions.

Portions of each of the first and second conductive patterns CP1 and CP2 may have a length (e.g., major dimension) and a width (e.g., minor dimension). In an embodiment, a width of a respective portion of a conductive pattern may be taken in a direction normal or perpendicular to the length thereof. A width of each of the first and second conductive patterns CP1 and CP2 may be substantially equal to or smaller than a distance between the penetration regions OPP1. FIG. 2A illustrates an example, in which the width of each of the first and second conductive patterns CP1 and CP2 is smaller than the distance between the penetration regions OPP1. FIGS. 3A and 3B illustrate an example, in which the width of each of the first and second conductive patterns CP1 and CP2 is substantially the same as the distance between the penetration regions OPP1.

In the embodiment shown in FIGS. 2B and 3C, the first and second conductive patterns CP1 and CP2 may be disposed to have the plurality of openings overlapped with or correspond to the penetration regions OPP1, in a plan view. In an embodiment, the first and second conductive patterns CP1 and CP2 may include or define a plurality of openings OPP2 (e.g., second openings or second deposition openings) which are respectively overlapped with the penetration regions OPP1 of the mask MK. The openings OPP2 are define in a respective portion of a conductive pattern. The openings OPP2 may be an enclosed opening defined in a solid portion of a respective portion of a conductive pattern. The openings OPP2 may be defined in the first electrode portions EP1 and the second electrode portions EP2 as the respective portion. The openings OPP2 and the penetration regions OPP1 may be aligned with each other along the third direction DR3, to form deposition openings or deposition holes. A second width LTH2 of each of the first and second conductive patterns CP1 and CP2 may be larger than a first width LTH1 of each of the penetration regions OPP1.

In an embodiment, since the mask film MF including or formed of the polymer resin is used as a main body of the mask MK, reducing an overall thickness of the mask MK and a process time and cost in a process of providing or forming the penetration regions OPP1 is possible, different from a comparative mask including or formed of alloys (e.g., Invar). In addition, since the mask MK includes the conductive layer CL disposed on the mask film MF, a magnetic element may be used to hold the mask MK to the target substrate SUB in the deposition process.

The conductive layer CL may include the first and second conductive patterns CP1 and CP2 each of which is connectable to an power source. The first and second conductive patterns CP1 and CP2 applied with opposite voltages provide a function of the conductive layer CL as an electrostatic chuck capable of more effectively holding the mask MK to the target substrate SUB. In other words, the conductive layer CL serving as a bipolar electrostatic chuck may interact with another bipolar electrostatic chuck disposed on the target substrate SUB, such that the target substrate SUB located therebetween may be more closely attached to the mask MK.

As a result, reduction of a shadow issue in a deposition process and thereby realizing a more precise deposition process is possible.

Figure 4:
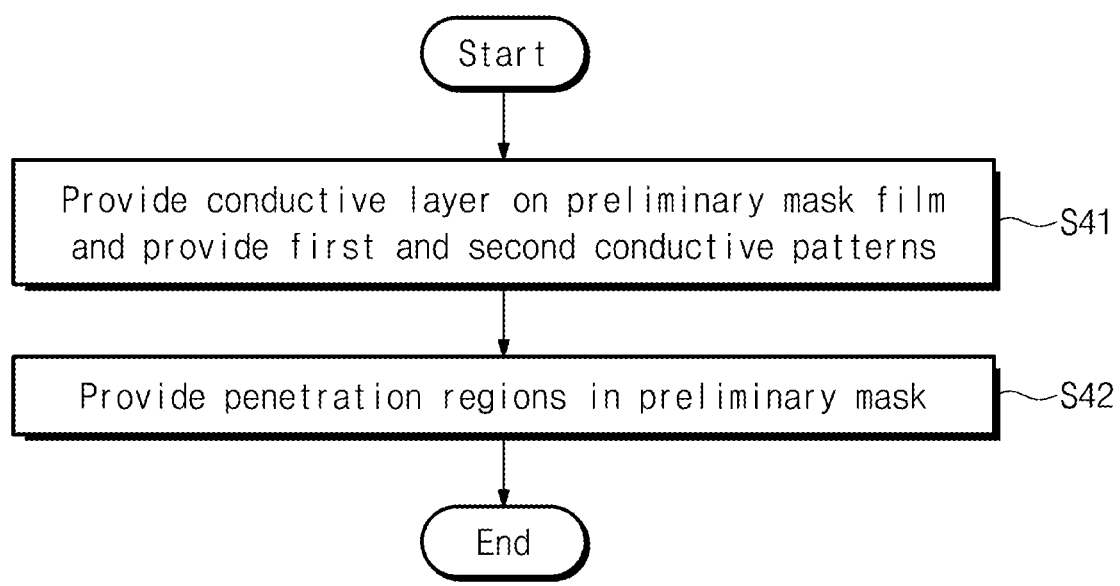
FIG. 4 is a flow chart illustrating an embodiment of a method of manufacturing a mask.

FIG. 4 is a flow chart illustrating an embodiment of a method of providing or manufacturing a mask MK. FIGS. 5A to 5H are cross-sectional views illustrating an embodiment of a method of providing a mask MK.

Referring to FIG. 4, the method of providing or manufacturing a mask MK may include providing the conductive layer CL in which the first and second conductive patterns CP1 and CP2 spaced apart from each other are provided, on a preliminary mask film MF-P (in S41).

The method may further include providing the penetration regions OPP1 in the preliminary mask film MF-P having the conductive layer CL thereon, to provide the mask film MF (in S42).

In an embodiment, the mask film MF (in S42) may be provided after the disposing of the conductive layer CL on the preliminary mask film MF-P (in S41).

The disposing of the conductive layer CL (in S41) may include depositing a conductive material CM1 on a carrier substrate CS to form a preliminary conductive layer CL-P. The providing of the conductive layer CL (in S41) may include patterning the preliminary conductive layer CL-P to provide the first and second conductive patterns CP1 and CP2.

In an embodiment, the penetration regions OPP1 may be provided after the providing of the first and second conductive patterns CP1 and CP2. Here, the providing of the penetration regions OPP1 may include providing the openings OPP2 in solid portions of the first and second conductive patterns CP1 and CP2 such as through a patterning process.

Figure 5A:
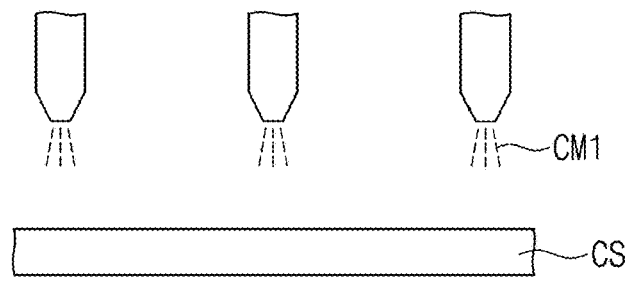
FIGS. 5A to 5H are diagrams illustrating embodiments of processes in a method of manufacturing a mask.

Referring to FIG. 5A, the providing of the preliminary conductive layer CL-P may include depositing a conductive material CM1 on the carrier substrate CS. The conductive material CM1 may include at least one of conductive metals (e.g., nickel (Ni), gold (Au), titanium (Ti) and molybdenum (Mo)), and conductive metal oxides (e.g., indium tin oxide ("ITO") and indium zinc oxide ("IZO")). The preliminary conductive layer CL-P may be providing by depositing the conductive material CM1. The preliminary conductive layer CL-P may be provided by depositing the conductive material CM1 such as using a physical deposition method (e.g., sputtering) or a chemical vapor deposition method ("CVD"), a plasma-enhanced chemical vapor deposition method ("PECVD"). In embodiments, the preliminary conductive layer CL-P may be provided by plating the conductive material CM1.

Figure 5B:
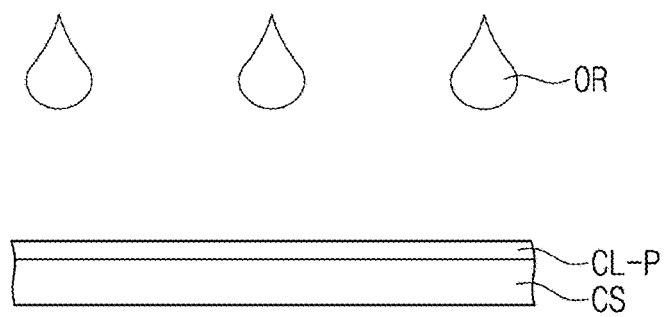
Figure 5C:
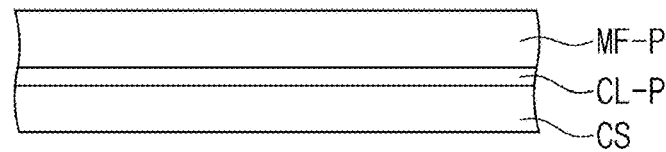

Referring to FIGS. 5B and 5C, the preliminary mask film MF-P may be provided by supplying a polymer resin OR on the preliminary conductive layer CL-P. The preliminary mask film MF-P may be provided by coating the polymer resin OR (e.g., polyimide ("PI")). Since the preliminary mask film MF-P is provided by coating the polymer resin OR, the preliminary mask film MF-P may have a solid plate shape that is parallel to the first and second directions DR1 and DR2.

FIGS. 5A to 5C illustrate an example, in which the preliminary conductive layer CL-P is provided on the carrier substrate CS and then the preliminary mask film MF-P is provided, but the invention is not limited to this example. In an embodiment, for example, the preliminary conductive layer CL-P may be omitted, and the preliminary mask film MF-P may be directly provided or formed on the carrier substrate CS.

Figure 5D:
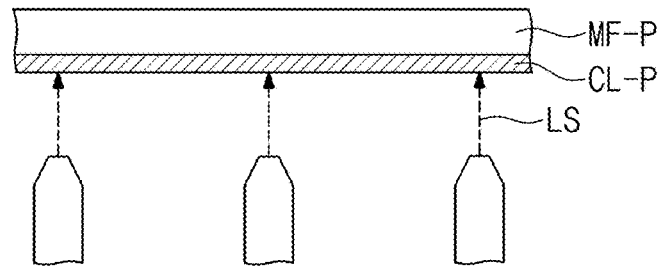
Figure 5E:
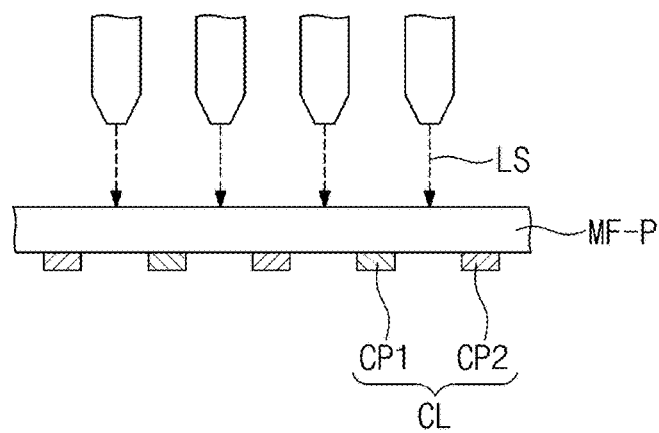
Figure 5F:
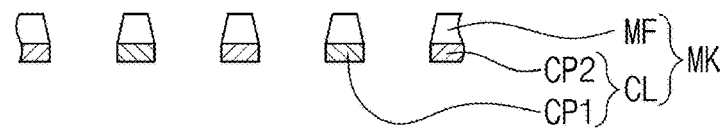

Referring to FIGS. 5D to 5F, the providing of the first and second conductive patterns CP1 and CP2 may include irradiating a laser LS onto the preliminary conductive layer CL-P to pattern the preliminary conductive layer CL-P to the conductive layer CL (including the first and second conductive patterns CP1 and CP2). The first and second conductive patterns CP1 and CP2 are in a same layer as each other, as being respective patterns of a same layer (e.g., the preliminary conductive layer CL-P). The first and second conductive patterns CP1 and CP2 may be spaced apart from each other. Thereafter, the laser LS may be irradiated onto regions of the preliminary mask film MF-P, which are not overlapped with the first and second conductive patterns CP1 and CP2, to provide the penetration regions OPP1 in the mask film MF.

In other words, the conductive layer CL including the first and second conductive patterns CP1 and CP2 may be disposed on the bottom surface of the mask film MF with the penetration regions OPP1 extending through both the conductive layer CL and the mask film MF.

In the method of providing the mask MK, the laser LS may be used for forming the penetration region OPP1, and the preliminary mask film MF-P which is patterned by the laser LS may include or be formed of the polymer resin OR (e.g., polyimide ("PI")). Thus, different from a comparative mask made of an alloy (e.g., Invar), reducing process time using the laser LS which reduces an amount of dust and suppressing a failure which may occur when the dust is absorbed on a processing surface of the penetration region OPP1 may be possible. Accordingly, time and cost in the mask providing process can be reduced, and a highly reliable deposition mask may be provided (for example, the mask MK). In addition, since the polymer resin (e.g., polyimide ("PI")) has high chemical resistance to a cleaning solution (e.g., methyl pyrrolidone ("NMP")), which is used to clean a deposition material DM, the mask MK may be used as a deposition mask for a subsequent process without the failure issue. After the formation of the penetration regions OPP1, the final structure of the mask MK may be prepared by removing the carrier substrate CS.

Figure 5G:
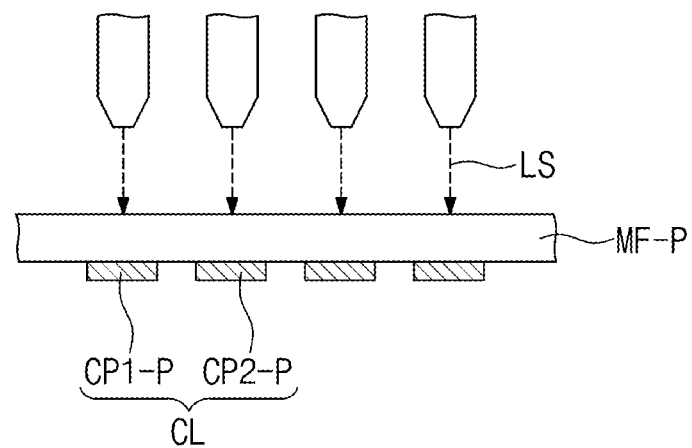
Figure 5H:
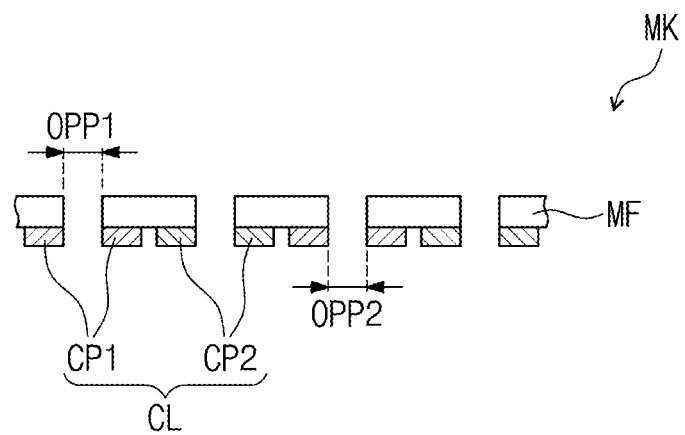

FIGS. 5G and 5H illustrate embodiments of the first and second conductive patterns CP1 and CP2 in an embodiment of a mask providing process.

Referring to FIGS. 5G and 5H, the providing of the first and second conductive patterns CP1 and CP2 may include providing a first preliminary conductive pattern CP1-P and a second preliminary conductive pattern CP2-P. The providing of the first and second preliminary conductive patterns CP1-P and CP2-P may include irradiating the laser LS onto the preliminary conductive layer CL-P (FIG. 5D) to pattern the preliminary conductive layer CL-P into the first and second preliminary conductive patterns CP1-P and CP2-P (FIG. 5G).

The first and second conductive patterns CP1 and CP2 may be providing by providing the penetration regions OPP1 such as by irradiating the laser LS onto the preliminary mask film MF-P.

After the providing of the first and second preliminary conductive patterns CP1-P and CP2-P on the preliminary mask film MF-P, the laser LS may be irradiated onto portions of the preliminary mask film MF-P at positions corresponding to the first and second preliminary conductive patterns CP1-P and CP2-P, to provide the penetration regions OPP1 in the preliminary mask film MF-P and the openings OPP2 in the first and second preliminary conductive patterns CP1-P and CP2-P. In other words, the laser LS which is irradiated onto the preliminary mask film MF-P, may pass through not only the preliminary mask film MF-P but also through the first and second preliminary conductive patterns CP1-P and CP2-P at locations corresponding to the penetration regions OPP1 and the openings OPP2.

The penetration regions OPP1 may be defined in the mask film MF and the openings OPP2 may be defined in the first and second conductive patterns CP1 and CP2. The penetration regions OPP1 and openings OPP2 may be aligned with each other along the third direction DR3.

In the embodiment shown in FIGS. 5G and 5H, the conductive layer CL including the first and second conductive patterns CP1 and CP2 with the openings OPP2 may be disposed on a bottom surface of the mask film MF which has the penetration regions OPP1.

FIG. 6 is a flow chart illustrating an embodiment of a method of providing a deposition pattern using a mask MK. FIGS. 7A to 7F are cross-sectional views illustrating an embodiment of a method of providing a deposition pattern. Hereinafter, the method will be described in more detail with reference to FIGS. 6 to 7F.

In the embodiment shown in FIG. 6, the method of providing a display panel DP may include disposing a first electrostatic chuck ESC on a top surface of a target substrate SUB (in S61).

In an embodiment, the method may include connecting the first electrostatic chuck ESC with a first power source PS1 and applying a voltage to the first electrostatic chuck ESC (in S62).

The method may include disposing the mask MK including the mask film MF and a conductive layer CL on a bottom surface of the target substrate SUB (in S63).

The method may include applying a power of a second power source PS2 to the conductive layer CL (in S64). Thereafter, deposition patterns corresponding to the penetration regions OPP1 of the mask MK may be provided or formed on the target substrate SUB (in S65).

Figure 7A:
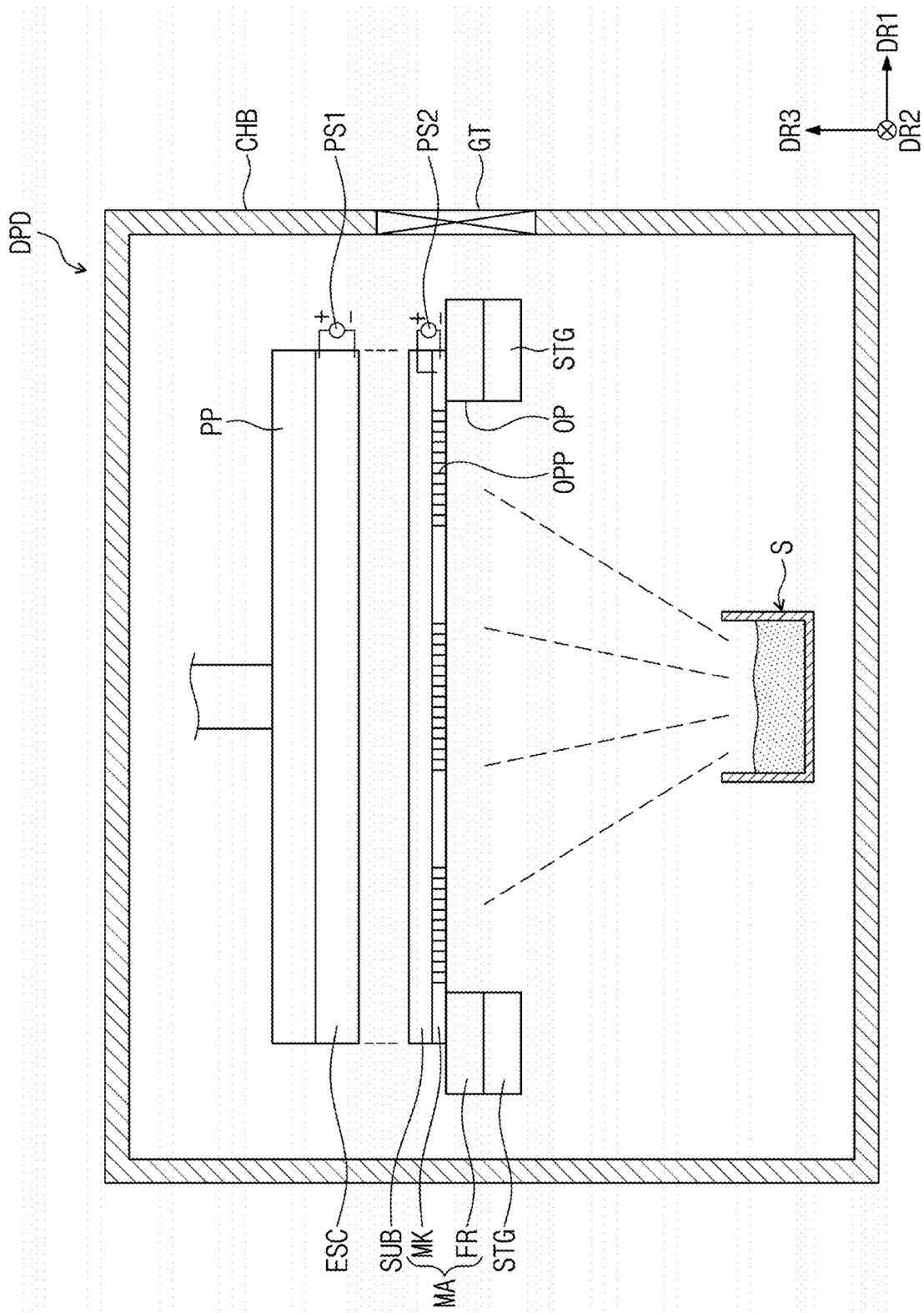
FIGS. 7A to 7F are diagrams illustrating embodiments of processes in a method of fabricating a display panel using a mask.

FIG. 7A is a cross-sectional view of an embodiment of a deposition device DPD.

Referring to FIG. 7A, a deposition device DPD may include a chamber CHB, a deposition source S (e.g., deposition material source), a stage STG, a moving plate PP, and the mask assembly MA.

The chamber CHB may provide a hermetically sealed space (e.g., deposition space). The deposition source S, the stage STG, the moving plate PP and the mask assembly MA may be disposed in the chamber CHB. The chamber CHB may have at least one gate GT. The chamber CHB may be opened or closed by the gate GT. The target substrate SUB may be loaded to or unloaded from the chamber CHB through the gate GT.

The deposition source S may include a deposition material DM. Here, the deposition material DM may include at least one of inorganic, metallic and organic materials, which can be sublimated or vaporized. The description that follows will refer to an example, in which the deposition source S includes an organic material used to fabricate an organic light-emitting device having a deposition pattern (e.g., see FIG. 9).

The stage STG may be disposed over the deposition source S. The mask assembly MA may be mounted on the stage STG. The mask assembly MA may be placed to face the deposition source S. The stage STG may be overlapped with the frame FR of the mask assembly MA to support the mask assembly MA. The stage STG may not be overlapped with the open region OP of the frame FR. The stage STG may include an open area corresponding to the open region OP of the frame FR. In other words, the stage STG may be disposed outside a supply path of a deposition material DM, which will be supplied from the deposition source S to the target substrate SUB.

The target substrate SUB may be disposed on the mask assembly MA. The deposition material DM may be deposited on the target substrate SUB through the penetration regions OPP1 which exposes deposition areas of the target substrate SUB to outside the mask MK.

The moving plate PP may align the target substrate SUB to the mask assembly MA. The moving plate PP may be movable in vertical and/or horizontal directions. In an embodiment, a static electricity inducing element such as the first electrostatic chuck ESC, may be disposed on the moving plate PP. The first electrostatic chuck ESC may include a main body which includes or is formed of ceramics, and an electrode which is buried in the main body and to which an electric power is applicable. A voltage applied to the electrode of the first electrostatic chuck ESC exerts an attractive electrostatic force on the conductive layer CL.

In the deposition device DPD, an electrostatic force may be used to move the target substrate SUB and/or to bring the mask MK into contact with the bottom surface of the target substrate SUB.

Figure 7B:
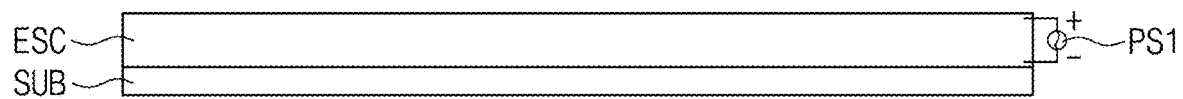

In the embodiment shown in FIG. 7B, the first electrostatic chuck ESC may be disposed on the top surface of the target substrate SUB. The first electrostatic chuck ESC may be applied with the power of the first power source PS1. In an embodiment, the first electrostatic chuck ESC may be disposed on the moving plate PP to be movable with the moving plate PP and fasten the target substrate SUB to the mask assembly MA. The mask MK in close contact with the target substrate SUB provides a more precise deposition process.

Figure 7C:
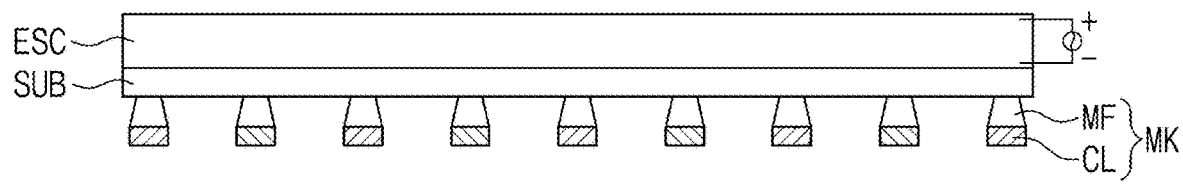

In the embodiment shown in FIG. 7C, the mask MK including the mask film MF and the conductive layer CL therebelow may be placed on the bottom surface of the target substrate SUB. The mask MK may face the first electrostatic chuck ESC with the target substrate SUB therebetween.

In the embodiment, the conductive layer CL of the mask MK may include the first and second conductive patterns CP1 and CP2 (e.g., see FIGS. 2A and 2B). The first and second conductive patterns CP1 and CP2 may be spaced apart from each other and may be electrically disconnected from each other.

Figure 7D:
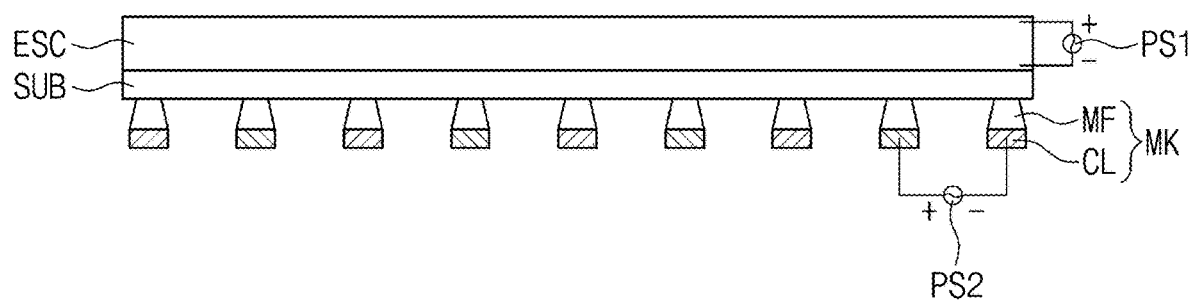

In the embodiment shown in FIG. 7D, positive/negative voltage of the second power source PS2 may be applied to the first conductive pattern CP1, and negative/positive voltage of the second power source PS2 may be applied to the second conductive pattern CP2. In other words, the conductive layer CL including the first and second conductive patterns CP1 and CP2 may be disposed on the bottom surface of the mask film MF and may serve as a second electrostatic chuck. In an embodiment, providing of a power of the second power source PS2 to the conductive layer CL may include providing a connection of one among the first conductive pattern CP1 and the second conductive pattern CP2 to a positive terminal of the second power source PS2, and providing connection of the other one among the first conductive pattern CP1 and the second conductive pattern CP2 to a negative terminal of the second power source PS2.

In an embodiment, an electrostatic force which is exerted from the first electrostatic chuck ESC on the top surface of the target substrate SUB, and an electrostatic force which is exerted from a second electrostatic chuck when the power of the second power source PS2 is applied to the conductive layer CL, may apply a force used to bring the target substrate SUB into contact with the mask MK in a more effective manner. In an embodiment, providing of the deposition mask (for example, the mask MK) facing the electrostatic chuck ESC may include the electrostatic chuck ESC provides a first electrostatic force thereof, the conductive layer CL of the deposition mask which receives the power provides a second electrostatic force of the deposition mask, and the first electrostatic force together with the second electrostatic force provides the mask film MF of the deposition mask in direct contact with the target substrate SUB.

In an embodiment, the target substrate SUB may be formed of or include a conductive material layer. In an embodiment, for example, the target substrate SUB may include a circuit device layer ML (for example, see FIG. 9). The circuit device layer ML may include a conductive material layer having a conductive property. The electrostatic force which is attractively exerted on the conductive layer CL of the mask MK by the first electrostatic chuck ESC disposed on the target substrate SUB, may be blocked by the conductive material layer included in the target substrate SUB. Blocking of the electrostatic force may dispose the target substrate SUB not in close contact with the mask film MF which includes polymer such that a shadow issue may occur.

In an embodiment, the mask MK may be used as the second electrostatic chuck when a power of the second power source PS2 is applied to a first conductive pattern CP1 and a second conductive pattern CP2 as respective patterns of the conductive layer CL. That is, the conductive layer CL receives the power at the first conductive pattern CP1 and the second conductive pattern CP2, and receipt of the power at the first conductive pattern CP1 and the second conductive pattern CP2 provides an electrostatic chuck function of the deposition mask (e.g., the mask MK). The mask MK may be forced toward the target substrate SUB to be in close contact with the target substrate SUB by an electrostatic force from the second electrostatic chuck. In other words, the target substrate SUB may be in close contact with the mask MK by a second electrostatic force and a first electrostatic force (e.g., electrostatic forces) which are respectively produced by the conductive layer CL having power applied thereto and the first electrostatic chuck ESC having power applied thereto.

Figure 7E:
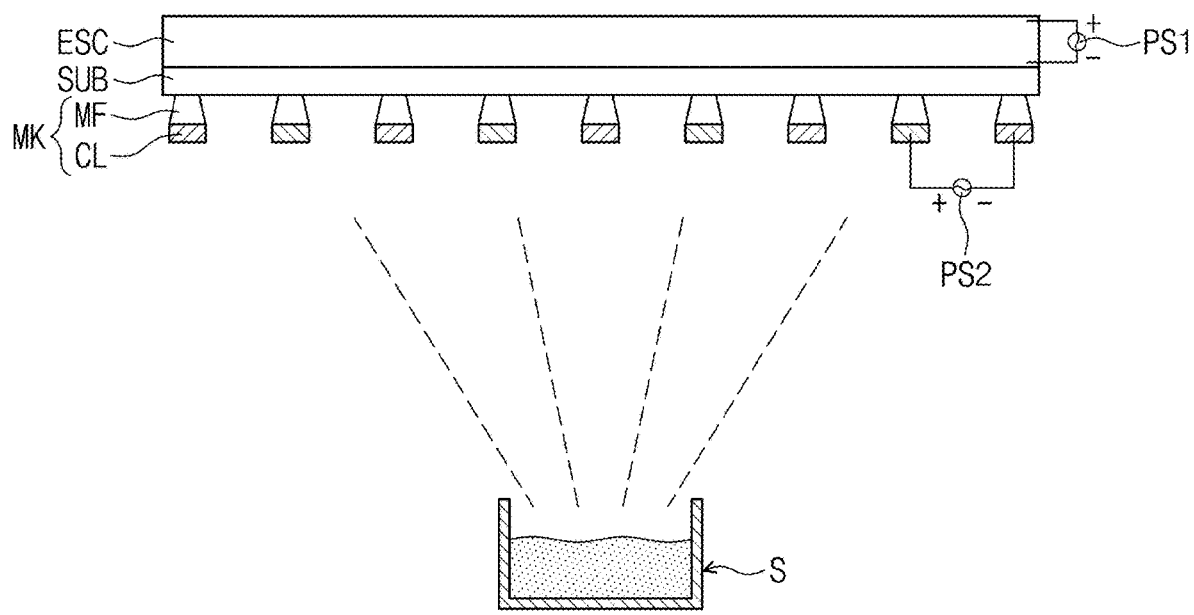
Figure 7F:
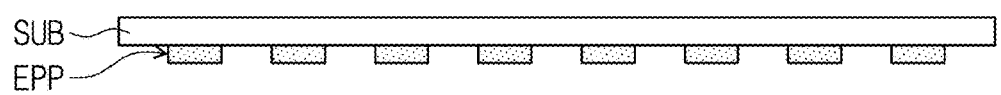

In the embodiment shown in FIGS. 7E and 7F, a deposition material DM supplied from the deposition source S may be deposited on the target substrate SUB. The deposition material DM may be deposited on regions (e.g., deposition areas) of the target substrate SUB through the penetration regions OPP1 of the mask MK. In an embodiment, for example, the deposition materials deposited on the target substrate SUB may include deposition patterns such as a light-emitting pattern EP provided to be a plurality of light-emitting patterns EP (for example, see FIG. 8C).

Figure 8A:
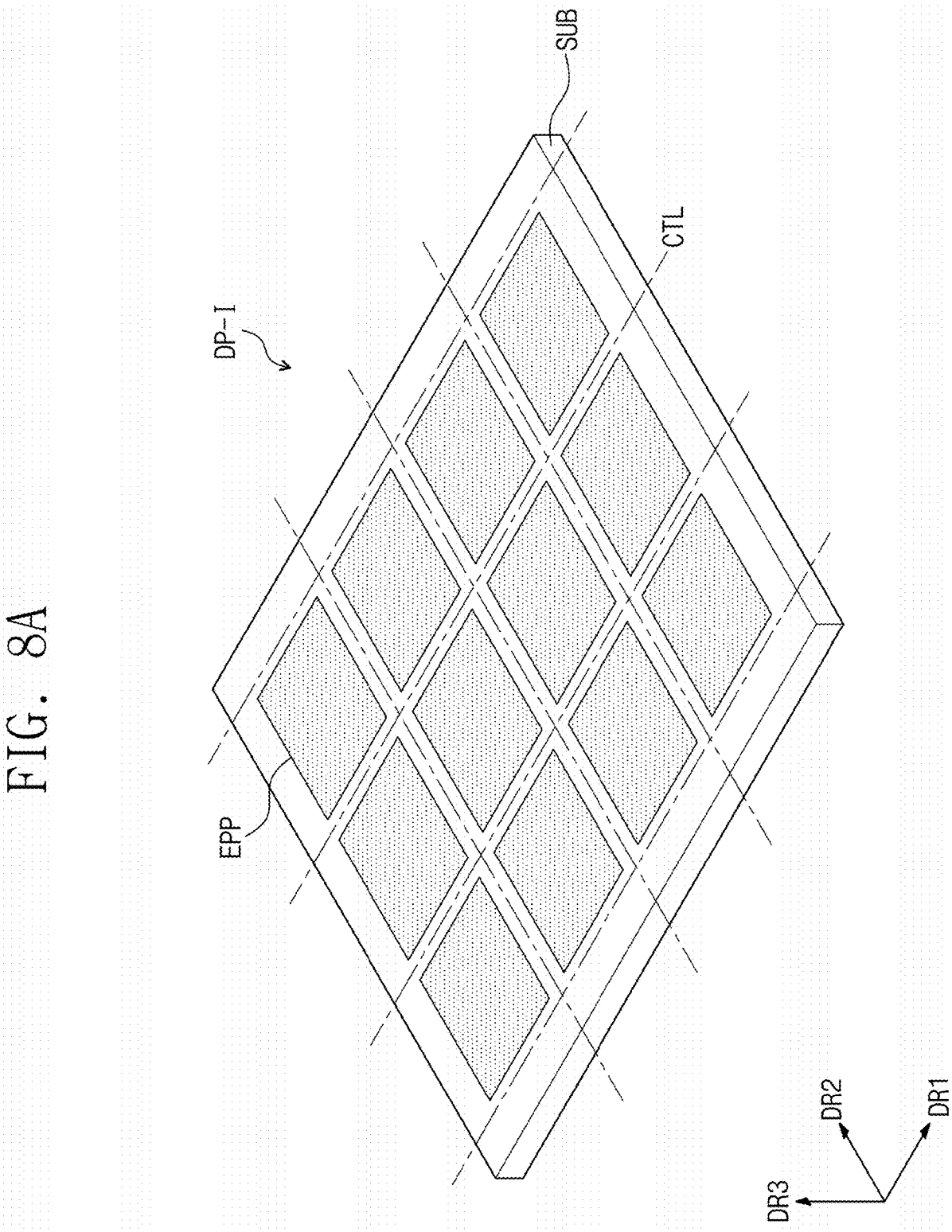
FIGS. 8A to 8C are perspective views schematically illustrating embodiments of processes in a method of fabricating a display panel using a mask.
Figure 8B:
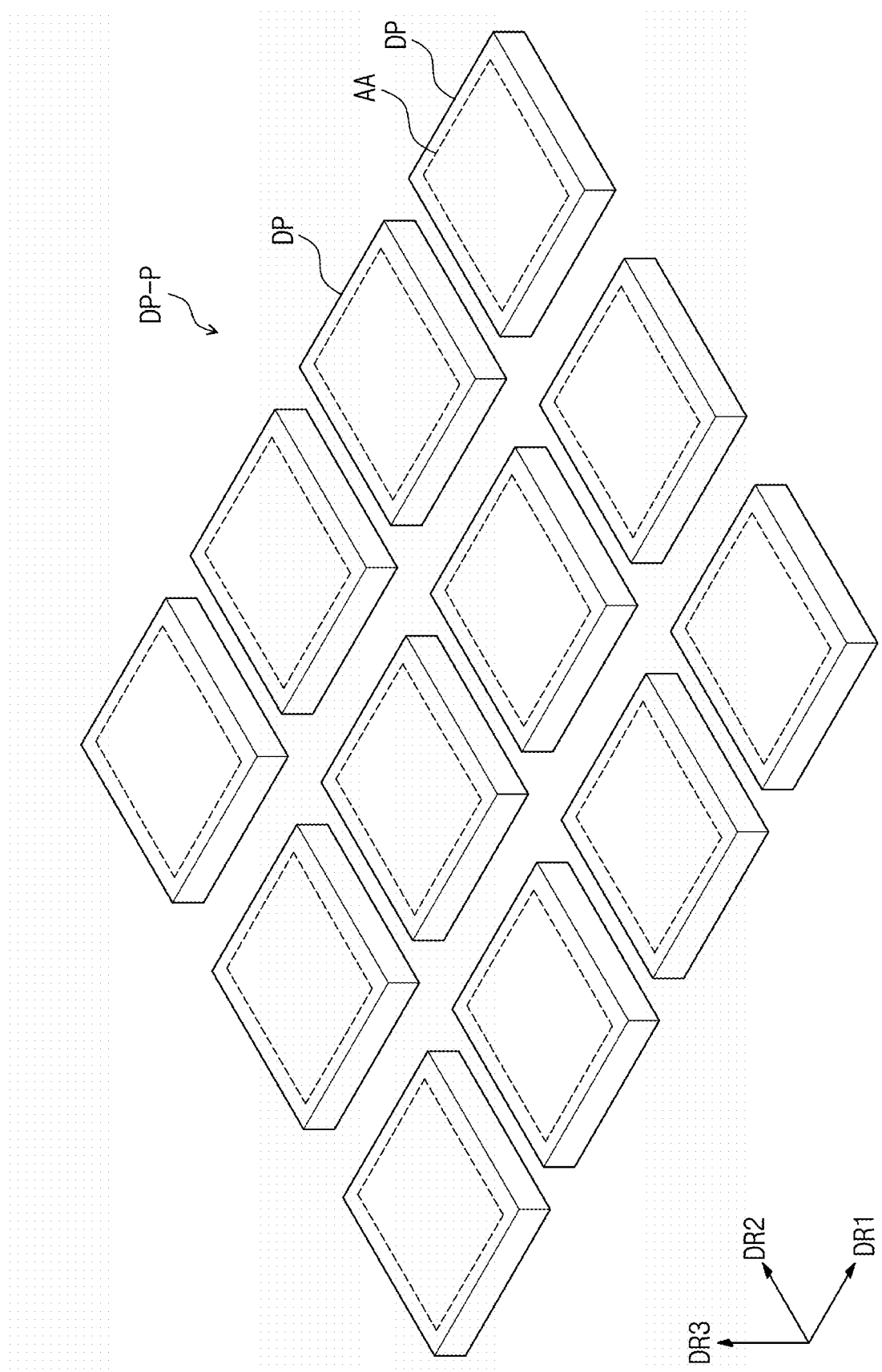
Figure 8C:
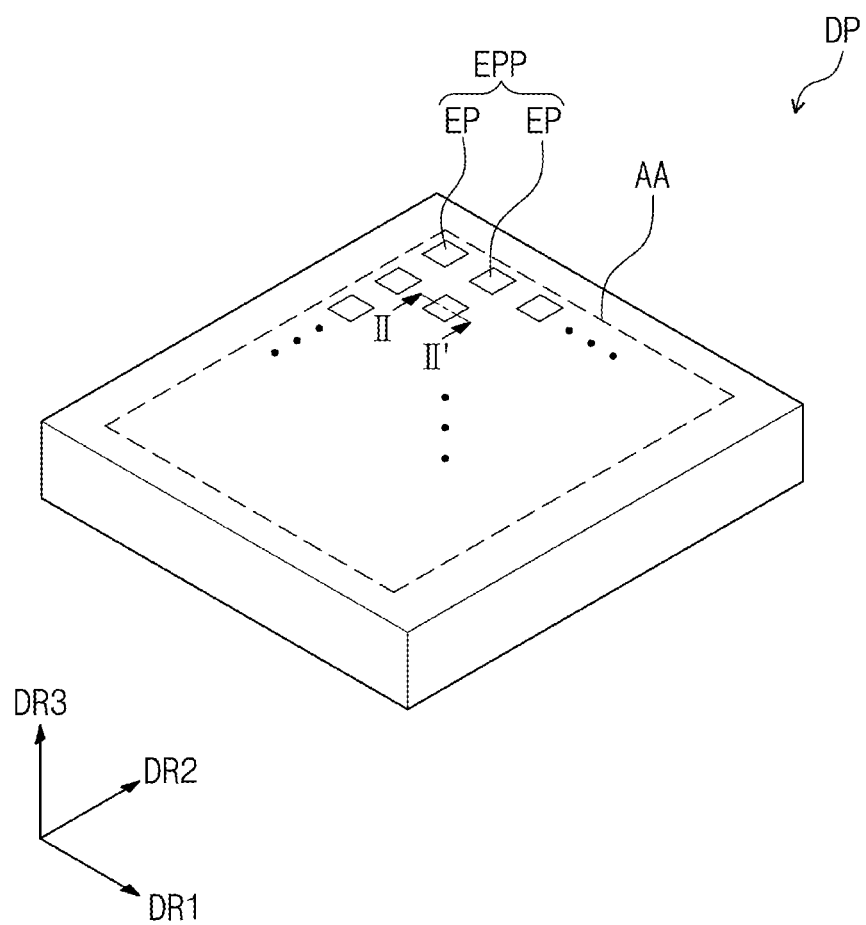

FIGS. 8A to 8C are perspective views schematically illustrating embodiments of processes in a method of providing a display panel DP.

Referring to FIGS. 7A and 8A, the mask assembly MA may be removed after depositing the deposition material DM in a deposition pattern on the target substrate SUB using the deposition device DPD. An initial substrate DP-I (e.g., preliminary display panel substrate or mother substrate) from which the mask assembly MA is removed, may have the light-emitting pattern layer EPP as deposition patterns on the target substrate SUB. The light-emitting pattern layer EPP may be provided or formed in deposition areas of the target substrate SUB which correspond to the cell regions CA of the mask MK. The light-emitting pattern layer EPP may include light-emitting patterns EP as deposition patterns of a display panel DP, respectively.

Referring to FIGS. 8A and 8B, the initial substrate DP-I from which the mask assembly MA is removed, may be divided into a plurality of preliminary panels DP-P by separating portions of the initial substrate DP-I along cutting lines CTL defined for the initial substrate DP-I. The cutting lines CTL may correspond to edges of the preliminary panels DP-P. Each of the preliminary panels DP-P may be used as a display panel DP among a plurality of display panels DP.

According to an embodiment, the display panels DP may be provided or formed by dividing the target substrate SUB having a deposition pattern thereon. In addition, since the mask MK used to form the display panel DP includes a mask main body including or made of a polymer material (e.g., polyimide ("PI")), the display panels DP may be provided or formed through a large-size mask process, such that time and cost for the process are reduced. However, the invention is not limited to this example, and in an embodiment, the target substrate SUB may be used to provide only one of the display panels DP depending on the size of the display panel DP.

Referring to FIG. 8C, the display panel DP may include an active region AA. The active region AA may include a plurality of pixels. The active region AA may correspond to a region including the light-emitting pattern layer EPP, and light-emitting patterns EP may correspond to the pixels, respectively. The light-emitting patterns EP may be provided or formed in regions corresponding to the penetration regions OPP1 of the mask MK, respectively.

Figure 9:
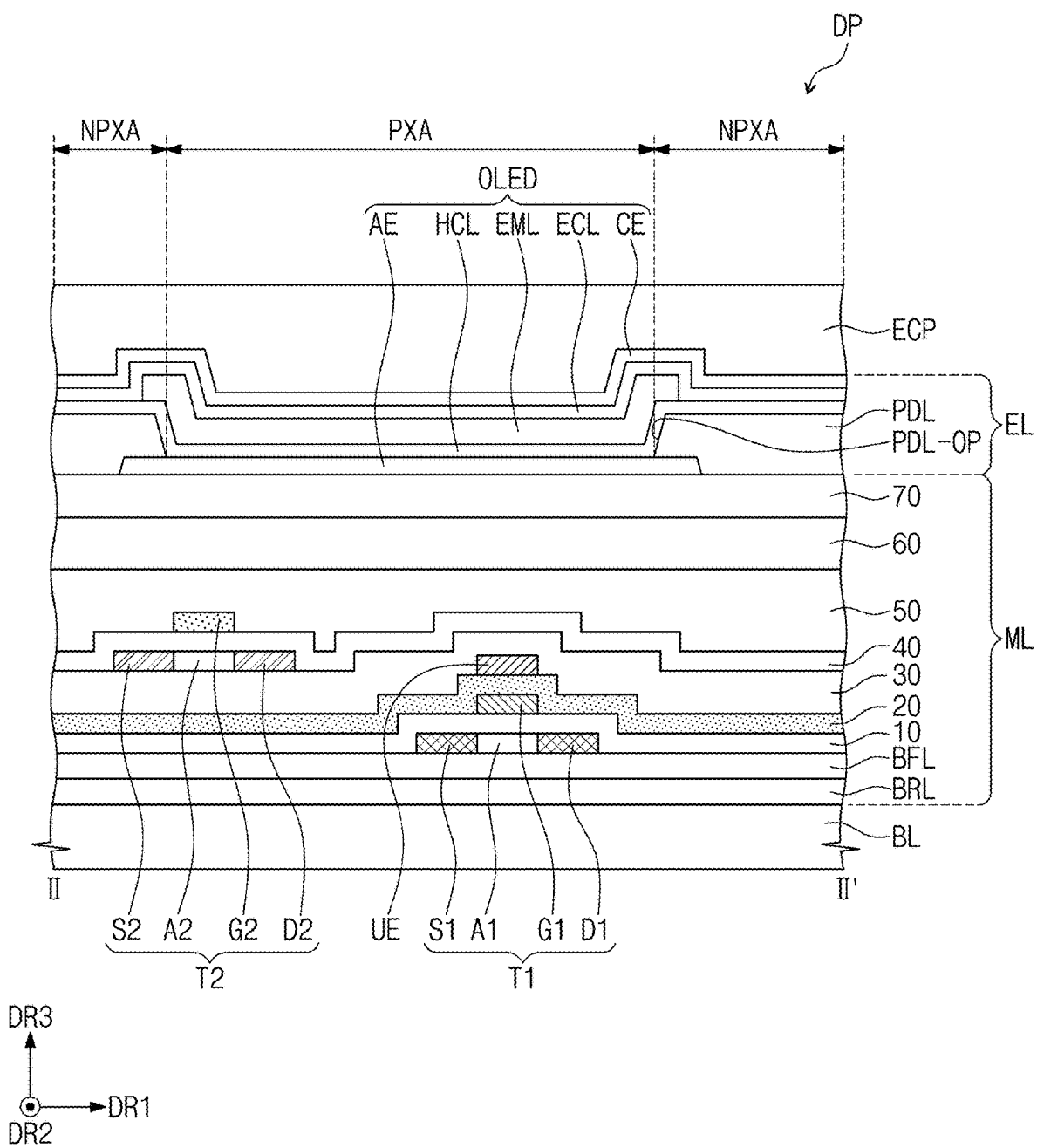
FIG. 9 is a cross-sectional view illustrating an embodiment of a display panel.

FIG. 9 is a cross-sectional view illustrating an embodiment of a display panel DP. FIG. 9 is a cross-sectional view illustrating an enlarged portion of the display panel DP taken along line X-X' of FIG. 8C.

Referring to FIG. 9, the display panel DP may be a light-emitting display panel. FIG. 9 illustrates a cross-section of a portion of one pixel in which two transistors T1 and T2 and a light-emitting device OLED such as an organic light-emitting device are disposed.

As shown in FIG. 9, the display panel DP may include a base layer BL, a circuit device layer ML disposed on the base layer BL, a display device layer EL disposed on the circuit device layer ML, and an upper insulating layer ECP disposed on the display device layer EL.

The base layer BL may include a synthetic resin layer. The base layer BL may be formed by forming a synthetic resin layer on a supporting substrate which is used to fabricate the display panel DP, providing or forming a conductive material layer, an insulating layer or the like on the synthetic resin layer, and then removing the supporting substrate.

The circuit device layer ML may include at least one insulating layer and a circuit device. The circuit device may include a signal line, a pixel driving circuit or the like. The providing of the circuit device layer ML may include providing or forming an insulating layer, a semiconductor layer and a conductive material layer such as using a coating or deposition process and patterning the insulating layer, the semiconductor layer and the conductive material layer such as by using a photolithography and etching process.

In the embodiment, the circuit device layer ML may include a buffer layer BFL, a barrier layer BRL, and first to seventh insulating layers 10, 20, 30, 40, 50, 60 and 70. The buffer layer BFL, the barrier layer BRL and the first to seventh insulating layers 10, 20, 30, 40, 50, 60 and 70 may include at least one of inorganic layers and organic layers. Each of the buffer layer BFL and the barrier layer BRL may include an inorganic layer. At least one of the fifth to seventh insulating layers 50, 60 and 70 may include an organic layer.

FIG. 9 illustrates an example of an arrangement structure of a first active region A1, a second active region A2, a first gate G1, a second gate G2, a first source S1, a second source S2, a first drain D1 and a second drain D2, which constitute the first and second transistors T1 and T2. A capacitor electrode pattern UE may overlap or correspond to the first gate G1. In the embodiment, the first active region A1 and the second active region A2 may include different materials from each other. The first active region A1 may include a poly silicon semiconductor material, and the second active region A2 may include a metal oxide semiconductor material. The first source S1 and the first drain D1 may be regions which have doping concentrations higher than the first active region A1 and serve as electrodes of a transistor. The second source S2 and the second drain D2 may be regions having a reduced metal oxide semiconductor material concentration and are used as electrodes of a transistor.

In an embodiment, the first active region A1 and the second active region A2 may include the same semiconductor material which simplifies the stacking structure of the circuit device layer ML.

The display device layer EL may include a pixel definition layer PDL and a light-emitting device OLED. The light-emitting device OLED may include an organic light-emitting diode or a quantum dot light-emitting diode. An anode AE may be disposed over the seventh insulating layer 70. A pixel opening PDL-OP of the pixel definition layer PDL may expose at least a portion of the anode AE to outside the pixel definition layer PDL. The pixel opening PDL-OP of the pixel definition layer PDL may define a light-emitting region PXA of the pixel. A non-light-emitting region NPXA of the pixel may be adjacent to the light-emitting region PXA. In an embodiment, the non-light-emitting region NPXA may be provided to enclose the light-emitting region PXA in a plan view.

A hole control layer HCL and an electron control layer ECL may be disposed in common in the light-emitting region PXA and the non-light-emitting region NPXA. A light-emitting layer EML may be provided in the form of a discrete pattern corresponding to the pixel opening PDL-OP. A light-emitting layer EML may be provided in a manner different from the hole and electron control layers HCL and ECL which each have an un-patterned shape (e.g., non-discrete shape). The hole control layer HCL and the electron control layer ECL may be provided or formed using an open mask, and thus, the hole control layer HCL and the electron control layer ECL may be provided or formed in common extending across a plurality of pixels. The light-emitting layer EML may be patterned to have a discrete shape corresponding to the pixel opening PDL-OP using one or more embodiment of the mask MK. However, the invention is not limited to this example, and similar to the light-emitting layer EML, the hole and electron control layers HCL and ECL may also be patterned to have a discrete shape corresponding to the pixel opening PDL-OP using one or more embodiment of the mask MK.

A cathode CE may be disposed on the electron control layer ECL. The upper insulating layer ECP may be disposed on the cathode CE. The upper insulating layer ECP may be a thin encapsulation layer which is used to encapsulate the display device layer EL. The upper insulating layer ECP may include a plurality of thin films. A plurality of thin films may include an inorganic layer and an organic layer. The upper insulating layer ECP may include an insulating sub-layer which is used to encapsulate the display device layer EL, and a plurality of insulating sub-layers which are used to improve light emission efficiency.

Figure 10A:
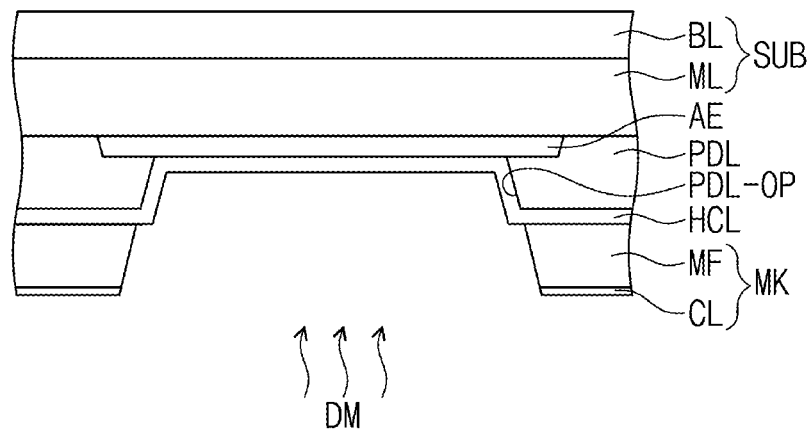
FIGS. 10A and 10B are cross-sectional views illustrating embodiments of processes in a method of fabricating a display panel using a mask.
Figure 10B:
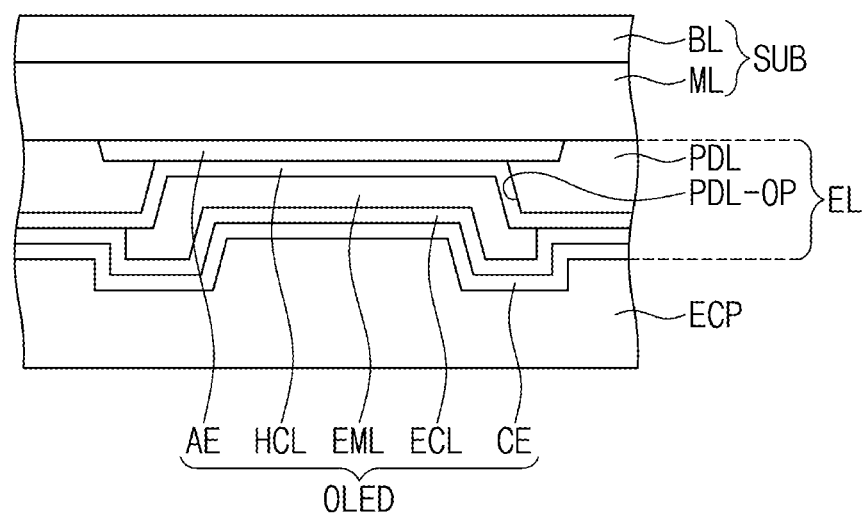

FIGS. 10A and 10B are cross-sectional views illustrating an embodiment of processes in a method of providing or fabricating a display panel DP. In detail, FIGS. 10A and 10B illustrate processes of providing a display device layer EL of a display panel DP.

Referring to FIGS. 7A, 9, 10A and 10B, in an embodiment of a method of providing a display panel DP, the light-emitting layer EML may be patterned using the mask MK to have a shape corresponding to a shape of the pixel opening PDL-OP. The target substrate SUB (FIG. 7A) may include the base layer BL and the circuit device layer ML and various other layers thereon.

In more detail, the light-emitting layer EML may be provided or formed in a region corresponding to the pixel opening PDL-OP by patterning a deposition material DM which is provided in a direction from the deposition source S in the deposition device DPD toward the target substrate SUB, using the mask MK. In the patterning of the light-emitting layer EML, the mask MK may be positioned facing the first electrostatic chuck ESC of the deposition device DPD with the target substrate SUB therebetween and contacting the mask MK (for example, FIG. 7C). In the embodiment, the conductive layer CL (e.g., the first and second conductive patterns CP1 and CP2) which is disposed on a surface of the mask film MF of the mask MK, may be connected to a power source and may be used to produce an electrostatic attractive force. As a result, a strong electrostatic attractive force may be produced between the conductive layer CL and the first electrostatic chuck ESC. Accordingly, the process of patterning the light-emitting layer EML may include the mask MK forcing toward the target substrate SUB to allow the mask MK to be in close contact with an element of the target substrate SUB (e.g., the hole control layer HCL on the pixel definition layer PDL in FIGS. 10A and 10B). The element of the target substrate SUB to which the mask MK is contacted may be a layer which is exposed outside a preliminary stacked structure (e.g., the lowermost layer on the target substrate SUB in FIG. 10A).

A conventional polymer mask may have hardness lower than a metal mask, and thus, the conventional polymer mask may suffer from a drooping problem. The conventional polymer mask which droops may produce a gap between the conventional polymer mask and the target substrate SUB, and a large shadow may be formed in a process of forming a deposition pattern. However, in one or more embodiment of the method of providing a display panel DP using the mask MK, a conductive layer CL may be provided on a surface of the mask film MF of the mask MK and may be used as the second electrostatic chuck. Thus, the deposition process may be performed under the condition that the mask MK is fully in contact with the target substrate SUB. Accordingly, a shadow produced in a deposition process of a light-emitting pattern EP may be reduced or effectively prevented to realize a more precise deposition process.

Figure 11B:
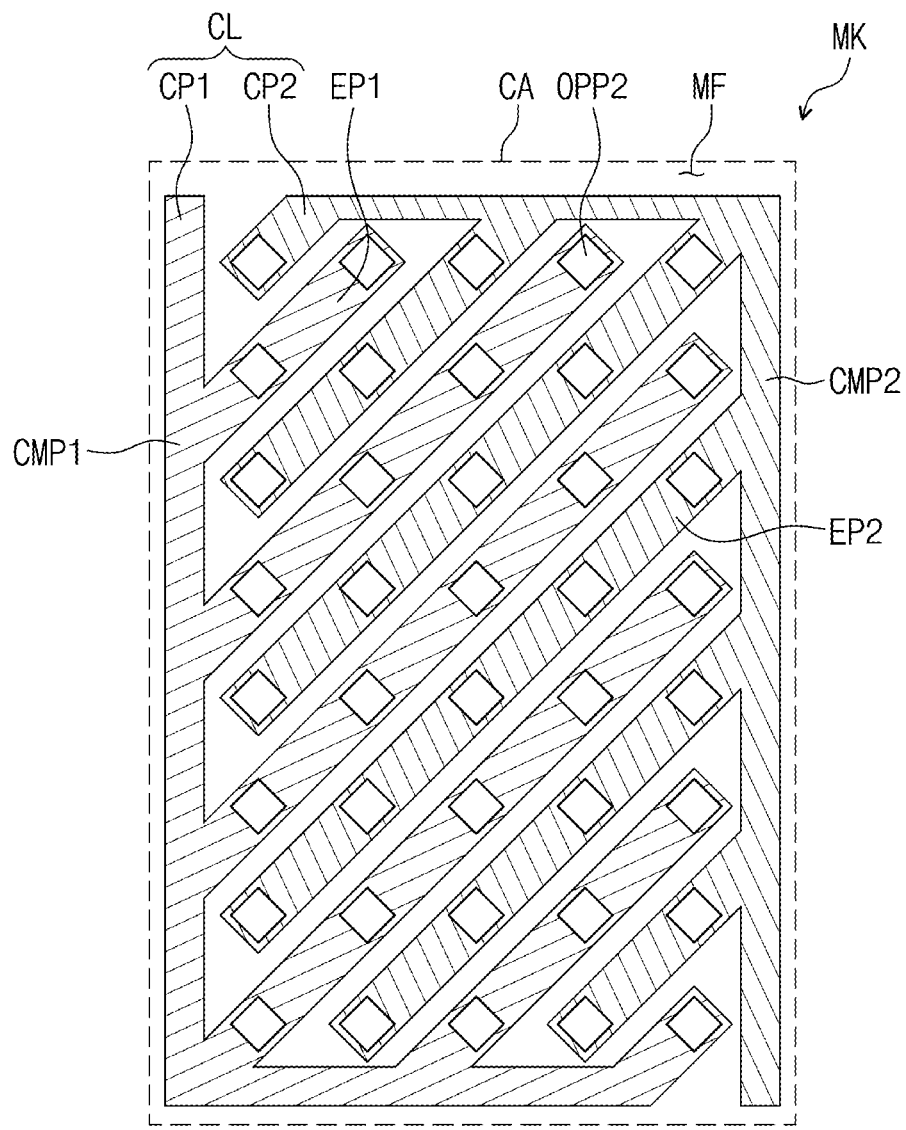

FIGS. 11A and 11B are plan views illustrating embodiments of a mask MK.

Referring to FIGS. 11A and 11B, the mask MK may include the penetration regions OPP1. In the embodiment, the penetration regions OPP1 may have a planar shape such as a rectangular or diamond shape. Each of the first and second conductive patterns CP1 and CP2 may include portions that are extended along a direction different from a direction related to the penetration regions OPP1 having a circular planar shape (refer to FIGS. 2A and 2B). In other words, lengths of the first and second electrode portions EP1 and EP2 of the first and second conductive patterns CP1 and CP2 may be extended in a diagonal direction inclined relative to the first and second directions DR1 and DR2.

In the embodiment shown in FIG. 11A, lengths of the first and second electrode portions EP1 and EP2 may be extended along a diagonal direction such that the first and second electrode portions EP1 and EP2 are not overlapped with the penetration regions OPP1 having the diamond-shape.

In the embodiment shown in FIG. 11B, lengths of the first and second electrode portions EP1 and EP2 may be extended along the diagonal direction such that the first and second electrode portions EP1 and EP2 are overlapped with the penetration regions OPP1 having the diamond-shape. The openings OPP2 may be defined in the first and second electrode portions EP1 and EP2 and may be aligned with the penetration regions OPP1, respectively.

In the embodiments shown in FIGS. 2A and 2B and FIGS. 11A and 11B, the first and second conductive patterns CP1 and CP2 may have different shapes. However, the shapes of the first and second conductive patterns CP1 and CP2 are not limited to these examples and may be variously changed.

Figure 12A:
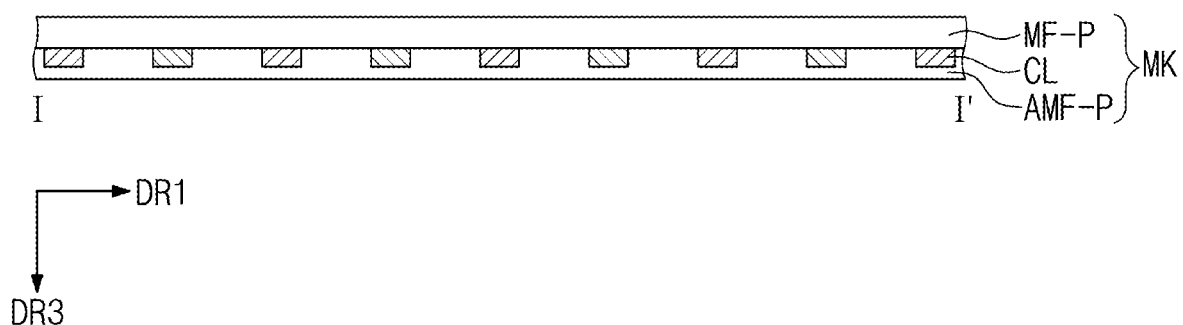
FIGS. 12A and 12B are cross-sectional views illustrating an embodiment of a mask.
Figure 12B:
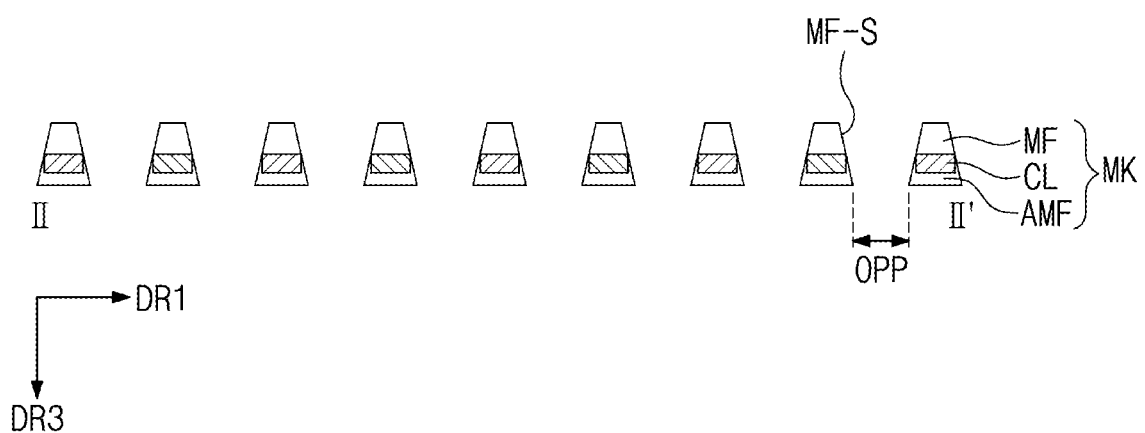
Figure 13:
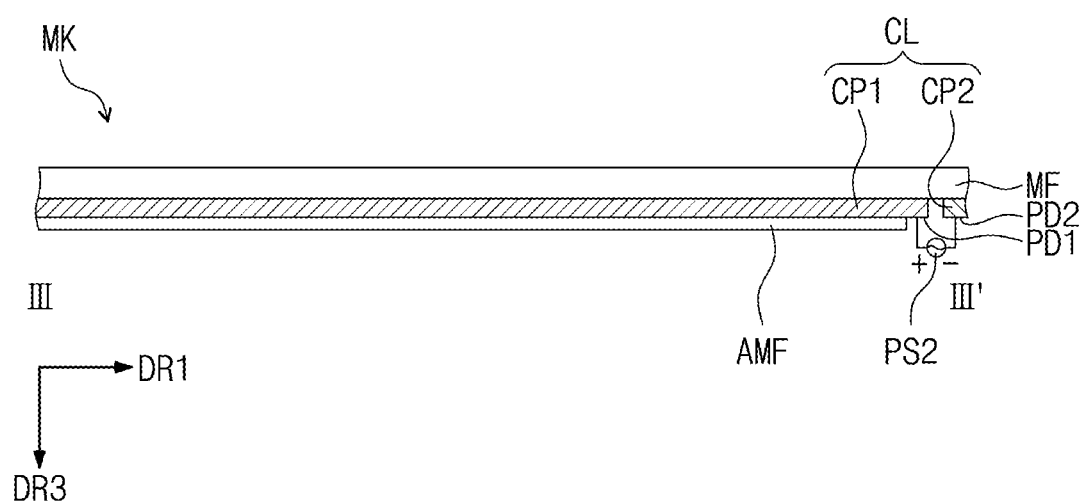
FIG. 13 is a cross-sectional view illustrating an embodiment of a mask.

FIGS. 12A and 12B are cross-sectional views illustrating an embodiment of a mask MK taken along lines I-I' and II-IF of FIG. 2A, respectively. FIG. 13 is a cross-sectional view illustrating an embodiment of a mask MK taken along line in FIG. 11A.

Referring to FIGS. 12A and 12B, a preliminary additional mask film AMF-P may be disposed facing the preliminary mask film MF-P with the conductive layer CL interposed therebetween, to cover the patterned conductive layer CL on the preliminary mask film MF-P. The mask film MF and the additional mask film AMF may be provided or formed by forming the penetration regions OPP1 extended through each of the preliminary mask film MF-P and the preliminary additional mask film AMF-P.

In other words, the mask MK in a final form may further include an additional mask film AMF additionally covering the conductive layer CL. The additional mask film AMF may be formed of or include the same material as the mask film MF. In an embodiment, for example, the additional mask film AMF may include a polymer material (e.g., polyimide ("PI")). In other words, the mask MK may further include the additional mask film AMF which is spaced apart from the mask film MF with the conductive layer CL interposed therebetween.

Referring to FIGS. 12B and 13, the conductive layer CL may be disposed between the mask film MF and the additional mask film AMF. Thus, the conductive layer CL except for a first pad portion PD1 and a second pad portion PD2, may not be exposed to outside the additional mask film AMF. The additional mask film AMF may be disposed on the mask film MF to expose a portion of each of the first and second conductive patterns CP1 and CP2 of the conductive layer CL. The exposed portion of the first conductive pattern CP1 may be the first pad portion PD1, and the exposed portion of the second conductive pattern CP2 may be the second pad portion PD2. That is, the first pad portion PD1 and the second pad portion PD2 of the conductive layer CL are exposed to outside the additional mask film AMF. The first pad portion PD1 and the second pad portion PD2 may be connectable to a second power source PS2 to produce an electrostatic force in the mask MK.

Since the mask MK includes the additional mask film AMF, upper and lower portions of the conductive layer CL may be veiled. Thus, a crack or delamination issue in the conductive layer CL in a subsequent cleaning process may be reduced or effectively prevented.

Figure 14:
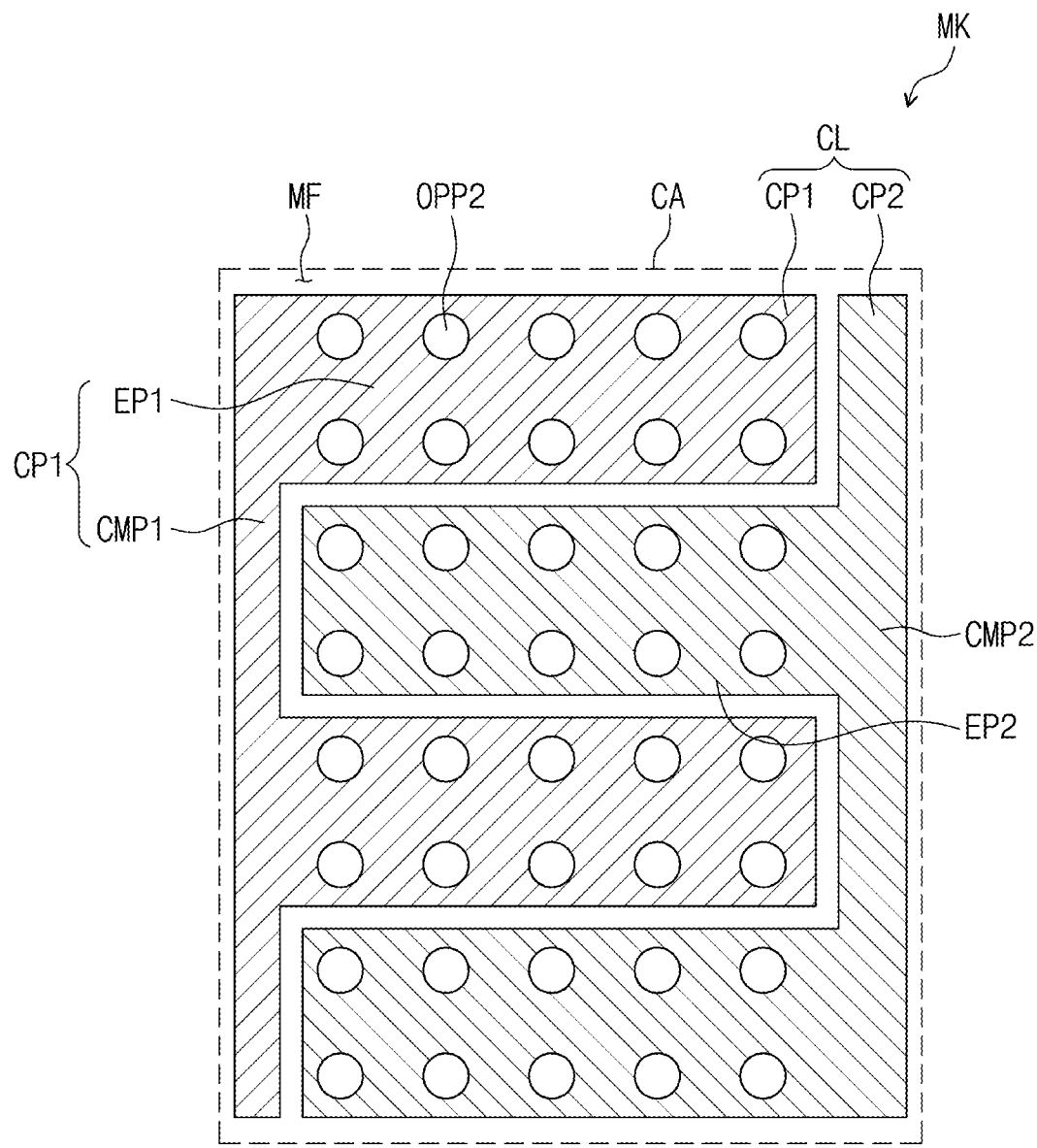
FIG. 14 is a plan view illustrating an embodiment of a mask.

FIG. 14 is a plan view illustrating an embodiment of a mask MK. Referring to FIGS. 2B and 14, the penetration regions OPP1 may be arranged in a plurality of rows and in a plurality of columns to form a matrix shape. In an embodiment, a plurality of the first electrode portions EP1 and a plurality of the second electrode portions EP2 may be provided. In the embodiment shown in FIG. 2B, each of the first electrode portions EP1 may be overlapped with one row of the penetration regions OPP1. Each of the second electrode portions EP2 may also be overlapped with one row of the penetration regions OPP1.

In the embodiment shown in FIG. 14, each of the first electrode portions EP1 may be overlapped with two or more rows of the penetration regions OPP1. Each of the second electrode portions EP2 may also be overlapped with two or more rows of the penetration regions OPP1. In the drawings, each first electrode portion EP1 is illustrated to be overlapped with two rows, but the invention is not limited to this example. In an embodiment, for example, each first electrode portion EP1 may be overlapped with three or more rows. Here, the row of penetration regions OPP1 may be extended along the second direction DR2, and a column of penetration regions OPP1 may be extended along the first direction DR1.

FIG. 15 is an enlarged image showing technical effects of one or more embodiment of the invention.

FIG. 15 shows a microscope image of comparative light-emitting patterns which were formed using a comparative mask according to a comparative example (left image in FIG. 15), and a microscope image of light-emitting patterns EP which were provided using an embodiment of a mask MK (right image in FIG. 15).

In an image IE of the light-emitting patterns EP which were formed by the mask MK (e.g., see FIG. 1), the shadow was reduced, the pixel precision was improved and the image was clear.

In contrast, the image IE-1 of the conventional light-emitting patterns which were formed when an electrostatic attractive force was not induced by an electrostatic chuck ESC, had a large shadow and a low pixel precision, such that a short or crack issue may be caused by the shadow. However, one or more embodiment of the mask MK reduces or effectively prevents the shadow issue from occurring in the deposition process of the light-emitting pattern EP, such that improving the deposition precision and providing of the pixel in a more precise manner is possible.

According to one or more embodiment of the invention, process time and cost in providing a deposition mask which is used to form a deposition pattern such as a light-emitting pattern EP and so forth may be reduced. Furthermore, reducing or effectively preventing a shadow from being formed when the light-emitting pattern EP is provided may be possible, such that failures occurring in providing a display panel DP using the mask MK may be reduced or effectively prevented.

While embodiments of the invention have been shown and described, it will be understood by one of ordinary skill in the art that variations in form and detail may be made therein without departing from the spirit and scope of the attached claims.

What is claimed is:

1. A deposition mask comprising:
a mask film comprising a polymer; and
a conductive layer which is on the mask film and receives a power,
wherein
the conductive layer comprises a first conductive pattern and a second conductive pattern which are electrically disconnected from each other and forming an interdigital pattern,
the first conductive pattern is spaced apart from the second conductive pattern, in a plan view,
a plurality of first deposition openings are defined in the mask film,
a plurality of second deposition openings are completely enclosed in each of the first conductive pattern and the second conductive pattern,
the plurality of second deposition openings are respectively aligned with the plurality of first deposition openings, in a thickness direction of the mask film,
the conductive layer receives the power at the first conductive pattern and the second conductive pattern, and
receipt of the power at the first conductive pattern and the second conductive pattern provides an electrostatic chuck function of the deposition mask.

2. The deposition mask of claim 1, wherein the mask film comprises polyimide.

3. The deposition mask of claim 1, wherein
the conductive layer comprises a conductive metal or a conductive metal oxide,
the conductive metal comprises at least one of nickel, gold, titanium and molybdenum, and
the conductive metal oxide comprises at least one of indium tin oxide and indium zinc oxide.

4. The deposition mask of claim 1, wherein
the first conductive pattern comprises a first common portion extended along a first direction and a plurality of first electrode portions which are each extended from the first common portion along a second direction crossing the first direction, and the second conductive pattern comprises a second common portion extended along the first direction and a plurality of second electrode portions which are each extended from the second common portion along the second direction.

5. The deposition mask of claim 4, wherein the first electrode portions and the second electrode portions alternate with each other along the first direction.

6. The deposition mask of claim 4, wherein the plurality of first electrode portions and the plurality of second electrode portions further comprise a plurality of second deposition openings which are respectively aligned with the plurality of first deposition openings, in the thickness direction of the mask film.

7. The deposition mask of claim 1, further comprising an additional mask film which faces the mask film with the conductive layer therebetween,
wherein the additional mask film comprises a polymer which is the same as the polymer of the mask film.

8. The deposition mask of claim 7, wherein
a portion of the first conductive pattern is exposed outside the additional mask film to define a first pad portion of the first conductive pattern at which the first conductive pattern receives the power, and
a portion of the second conductive pattern is exposed outside the additional mask film to define a second pad portion of the second conductive pattern at which the second conductive pattern receives the power.

9. The deposition mask of claim 1, wherein
the deposition mask having the electrostatic chuck function is removably attachable to a target substrate in a deposition process, and
the deposition mask which is removably attached to the target substrate disposes the mask film between the conductive layer and the target substrate.

10. A method of providing a deposition mask, the method comprising:
providing a preliminary mask film including a polymer resin;
providing a plurality of first deposition openings extended through the preliminary mask film to define a mask film of the deposition mask; and
providing a conductive layer which is on the mask film and receives a power,
wherein
the providing the plurality of first deposition openings in the preliminary mask film comprises irradiating a laser through the preliminary mask film and the conductive layer to respectively define the plurality of first deposition openings and a plurality of second deposition openings,
the conductive layer includes a first conductive pattern and a second conductive pattern spaced apart from the first conductive pattern, the first conductive pattern and the second conductive pattern electrically disconnected from each other and forming an interdigital pattern,
the plurality of second deposition openings are completely enclosed in each of the first conductive pattern and the second conductive pattern,
the conductive layer receives the power at the first conductive pattern and the second conductive pattern, and
receipt of the power at the first conductive pattern and the second conductive pattern provides an electrostatic chuck function of the deposition mask.

11. The method of claim 10, wherein the polymer resin comprises polyimide.

12. The method of claim 10, wherein
the conductive layer comprises a conductive metal or a conductive metal oxide,
the conductive metal comprises at least one of nickel, gold, titanium and molybdenum, and
the conductive metal oxide comprises at least one of indium tin oxide and indium zinc oxide.

13. The method of claim 10, further comprising providing an additional mask film facing the mask film to cover the conductive layer therebetween.

14. A method of providing a display panel, the method comprising:
providing a target substrate;
providing an electrostatic chuck facing the target substrate;
providing a deposition mask comprising:
a mask film comprising a polymer and in which a plurality of first deposition openings of the deposition mask are defined; and
a conductive layer which is on the mask film and receives a power;
providing the deposition mask facing the electrostatic chuck with the target substrate therebetween to dispose the target substrate, the mask film and the conductive layer in order from the electrostatic chuck; and
providing a plurality of deposition patterns of the display panel which are on the target substrate and correspond to the plurality of first deposition openings of the deposition mask
wherein the providing of the deposition mask comprises:
providing a preliminary conductive layer on the mask film;
providing a first conductive pattern and a second conductive pattern spaced apart from the first conductive pattern of the conductive layer and electrically disconnected from each other and forming an interdigital pattern;
providing the first deposition openings in the mask film; and
providing a plurality of second deposition openings which are completely enclosed in each of the first conductive pattern and the second conductive pattern.

15. The method of claim 14, wherein the providing of the deposition mask facing the electrostatic chuck comprises:
providing a first power to the electrostatic chuck to provide a first electrostatic force thereof, and
providing a second power to the conductive layer to provide a second electrostatic force of the deposition mask.

16. The method of claim 15, wherein
the providing of the second power to the conductive layer comprises:
providing a connection of one among the first conductive pattern and the second conductive pattern to a positive terminal of the second power, and
providing connection of the other one among the first conductive pattern and the second conductive pattern to a negative terminal of the second power.

17. The method of claim 14, wherein
the mask film comprises polyimide,
the conductive layer comprises a conductive metal or a conductive metal oxide,
the conductive metal comprises at least one of nickel, gold, titanium and molybdenum, and the conductive metal oxide comprises at least one of indium tin oxide or indium zinc oxide.

18. The method of claim 14, wherein the providing of the deposition mask facing the electrostatic chuck comprises:
the electrostatic chuck providing a first electrostatic force thereof,
the conductive layer of the deposition mask which receives the power providing a second electrostatic force of the deposition mask, and
the first electrostatic force together with the second electrostatic force providing the mask film of the deposition mask in direct contact with the target substrate.

19. The method of claim 14, wherein
the conductive layer receives the power at the first conductive pattern and the second conductive pattern, and
receipt of the power at the first conductive pattern and the second conductive pattern provides an electrostatic chuck function of the deposition mask.

* * * * *